United States Patent
Curran et al.

(10) Patent No.: US 9,705,103 B2
(45) Date of Patent: Jul. 11, 2017

(54) WRAPPED OPTOELECTRONIC DEVICES AND METHODS FOR MAKING SAME

(75) Inventors: Seamus Curran, Pearland, TX (US); Sampath Dias, Houston, TX (US); Nigel Alley, Houston, TX (US); Amrita Haldar, Houston, TX (US); Soniya Devi Yambem, Houston, TX (US); Liao Kang-Shyang, Houston, TX (US); Prajakta Chaudhari, Houston, TX (US)

(73) Assignee: UNIVERSITY OF HOUSTON, Houston, TX (US)

( * ) Notice: Subject to any disclaimer, the term of this patent is extended or adjusted under 35 U.S.C. 154(b) by 274 days.

(21) Appl. No.: 12/816,288

(22) Filed: Jun. 15, 2010

(65) Prior Publication Data

US 2010/0313944 A1     Dec. 16, 2010

Related U.S. Application Data

(60) Provisional application No. 61/187,131, filed on Jun. 15, 2009.

(51) Int. Cl.
*H01L 31/00* (2006.01)
*H01L 51/52* (2006.01)
(Continued)

(52) U.S. Cl.
CPC .............. *H01L 51/52* (2013.01); *B82Y 10/00* (2013.01); *H01G 9/2086* (2013.01);
(Continued)

(58) Field of Classification Search
CPC ... H01L 51/52; H01L 51/426; H01L 51/0036; H01L 51/0047; Y02P 70/521;
(Continued)

(56) References Cited

U.S. PATENT DOCUMENTS 6,617,613 B2 * 9/2003 Matsuo et al. ................ 257/79
6,687,266 B1 * 2/2004 Ma et al. ........................ 372/7
(Continued)

FOREIGN PATENT DOCUMENTS

EP     0999598     * 10/2000
EP     1207572 A1    5/2002
(Continued)

OTHER PUBLICATIONS

Li et al, "Efficient inverted polymer solar cells", Jun. 2006.*
(Continued)

*Primary Examiner* — Tamir Ayad
*Assistant Examiner* — Uyen Tran
(74) *Attorney, Agent, or Firm* — WINSTEAD PC

(57) ABSTRACT

In various embodiments, optoelectronic devices are described herein. The optoelectronic device may include an optoelectronic cell arranged so as to wrap around a central axis wherein the cell includes a first conductive layer, a semi-conductive layer disposed over and in electrical communication with the first conductive layer, and a second conductive layer disposed over and in electrical communication with the semi-conductive layer. In various embodiments, methods for making optoelectronic devices are described herein. The methods may include forming an optoelectronic cell while flat and wrapping the optoelectronic cell around a central axis. The optoelectronic devices may be photovoltaic devices. Alternatively, the optoelectronic devices may be organic light emitting diodes.

19 Claims, 17 Drawing Sheets

(51) Int. Cl.
  *B82Y 10/00* (2011.01)
  *H01G 9/20* (2006.01)
  *H01L 51/42* (2006.01)
  *H01L 51/00* (2006.01)

(52) U.S. Cl.
  CPC ........ *H01L 51/426* (2013.01); *H01L 51/0036* (2013.01); *H01L 51/0047* (2013.01); *Y02E 10/542* (2013.01); *Y02E 10/549* (2013.01); *Y02P 70/521* (2015.11)

(58) Field of Classification Search
  CPC ..... Y02E 10/542; Y02E 10/549; B82Y 10/00; H01G 9/2086
  USPC ......................................................... 136/255
  See application file for complete search history.

(56) References Cited

U.S. PATENT DOCUMENTS

| | | | | |
|---|---|---|---|---|
| 2005/0062174 A1* | 3/2005 | Ingle | ............................ | 257/788 |
| 2005/0175831 A1 | 8/2005 | Kim et al. | | |
| 2007/0202797 A1* | 8/2007 | Ishibashi | ................ | G11C 11/16 454/230 |
| 2008/0110491 A1* | 5/2008 | Buller et al. | ................... | 136/249 |
| 2008/0276983 A1* | 11/2008 | Drake et al. | ................. | 136/251 |

FOREIGN PATENT DOCUMENTS

| | | | | |
|---|---|---|---|---|
| JP | 11265785 | * | 9/1999 | ................... 136/255 |
| JP | 11265785 A | | 9/1999 | |
| WO | 2007004118 A2 | | 1/2007 | |
| WO | 2007129827 A1 | | 11/2007 | |
| WO | WO2007130025 | * | 11/2007 | |

OTHER PUBLICATIONS

United States Patent and Trademark Office, Office Communication dated May 9, 2012, U.S. Appl. No. 12/669,370, filed Jun. 28, 2010.
International Search Report and Written Opinion, PCT/US10/038723, Sep. 22, 2010.

* cited by examiner

WRAPPED OPTOELECTRONIC DEVICES AND METHODS FOR MAKING SAME

This application claims priority to U.S. provisional patent application Ser. No. 61/187,131, filed Jun. 15, 2009, entitled "Organic Photovoltaic Pixel Tandem Wrap Cell", hereby incorporated by reference herein in its entirety.

STATEMENT REGARDING FEDERALLY SPONSORED RESEARCH

This invention was made in part with United States Government support under a Department of Energy grant DE-FG36-08G088008. The U.S. Government has certain rights in this invention.

BACKGROUND

Plastic (polymer) materials have received considerable attention as a new medium for use in photonic-based electronics for at least the last two decades. Photovoltaic devices such as, for example, solar cells, convert electromagnetic radiation into electricity by producing a photo-generated current when connected across a load and exposed to light. Polymers and their composite derivatives have high commercial potential for use in such photovoltaic devices due to their favorable optical properties. First, certain polymers can convert almost all resonant light into energy through charge carrier generation. Second, the optical absorption of the polymers and their composite derivatives can be tailored to provide a desired bandgap. For instance, a bandgap of 1.1 eV is present in today's silicon-based photovoltaic devices. Third, simple and cost-effective production techniques are well established in the manufacturing arts for making polymer thin films.

Even though the first plastic solar cells were fabricated about twenty years ago, conversion efficiencies for polymer-based photovoltaic devices have yet to match those of inorganic thin film photovoltaic devices. Current polymer-based photovoltaic devices typically display conversion efficiencies of only slightly greater than 5%. In contrast, commercial photovoltaic devices utilizing crystalline or amorphous silicon commonly have conversion efficiencies greater than 20% for crystalline silicon and between 4 to 12% for amorphous silicon.

There are several reasons that polymer-based photovoltaic devices have failed to function at high efficiencies. A first reason is poor charge carrier transport. Although polymers and polymer composites can convert almost all resonant light into charge carriers (electrons, holes or excitons), carrier transport is generally poor. Poor charge carrier transport arises for at least the following two reasons: 1) Excitons travel only very short distances (typically about 50 nm) before being recombined; and 2) Polymer-based photovoltaic materials generally show poor carrier mobilities and conductivities. As a consequence of poor charge carrier transport, polymer-based photovoltaic devices have typically been fabricated from ultra-thin, semi-conductive polymer films, typically less than about 250 nm. As a further consequence of having such ultra-thin, semi-conductive polymer films, significant incident light upon the devices is lost due to transparency. Another substantial drawback of polymer-based photovoltaic devices is the propensity for polymer-based photovoltaic materials to undergo oxidative degradation. Accordingly, stringently-controlled assembly conditions and active device protection are often needed when working with the polymer-based photovoltaic materials. Finally, although the absorption range of polymer-based photovoltaic devices can be adjusted through chemical modification of the polymer or polymer composite, the absorption range of any given organic material is inherently limited to only certain regions of the electromagnetic spectrum. Accordingly, only a portion of the electromagnetic spectrum is capable of interacting with the photovoltaic device containing a given photovoltaic material.

As completely different issues are associated with polymer-based photovoltaic materials compared to inorganic photovoltaic materials, it is apparent from the foregoing that a new approach and architecture for working with polymer-based photovoltaic devices would be of substantial benefit in the art.

SUMMARY

In various embodiments, optoelectronic devices are described herein. The optoelectronic devices include an optoelectronic cell arranged so as to wrap around a central axis where the optoelectronic cell includes a first conductive layer, a semi-conductive layer disposed over and in electrical communication with the first conductive layer, and a second conductive layer disposed over and in electrical communication with the semi-conductive layer.

In various embodiments, at least one of the first conductive layer and the second conductive layer is oriented radially outwardly from the other.

In various embodiments, one or more of the conductive layers is patterned so as to comprises a plurality of electrodes. An optoelectronic device architecture incorporating a plurality of electrodes is termed herein a pixel architecture. In such an architecture, the patterned conductive layer may be discontinuous.

In various embodiments, the semi-conductive layer absorbs electromagnetic radiation and turns the electromagnetic radiation into an electrical signal. The semi-conductive layer may be made up of at least one semi-conductive material. The semi-conductive material may be an organic semi-conductive material. The organic semi-conductive material may include a polymer. The organic semi-conductive material may further include a filler such that the semi-conductive material is a polymer-based hybrid material. The composition of the hybrid semi-conductive material may be adjusted so as to control the wavelength of electromagnetic radiation absorbed.

In various embodiments, the semi-conductive layer may include at least two semi-conductive materials that are substantially unmixed and are located in separate regions along the longitudinal axis of the optoelectronic device. The separate regions may be contiguous such that the polymer layer is continuous. Alternatively, the separate regions may be displaced such that the polymer layer is discontinuous. The semi-conductive materials may be selected from various hybrid materials which each include the same base polymer and the same additive, mixed in various concentrations such that each separate region of the semi-conductive layer contains a material absorbing in a different wavelength region of the electromagnetic spectrum. A photovoltaic device architecture incorporating separate regions of unmixed semi-conductive materials is termed herein a tandem architecture.

In various embodiments, the optoelectronic device further includes a central support. The support may be solid. Alternatively, the support may be tubular. When the support is tubular, it may act as a waveguide. Further, when the support is tubular, it may receive light at an open end.

In various embodiments the above features occur singly or in combination. Thus, for example, in various embodiments, an organic optoelectronic device has a pixel tandem wrap cell architecture.

In various embodiments, photovoltaic collectors including a plurality of optoelectronic devices are described. The plurality of optoelectronic devices is in electrical contact with an output circuit.

In other various embodiments, methods for preparing optoelectronic devices are disclosed. The methods include forming an optoelectronic cell while flat and wrapping the optoelectronic cell about a central axis. In operation, the optoelectronic device may receive, or emit, light along the central axis.

In various embodiments, forming the optoelectronic cell includes depositing a first conductive layer over a substrate, depositing a semi-conductive layer over the first conductive layer, and depositing a second conductive layer over the semi-conductive layer.

In various embodiments, depositing the semi-conducting layer includes providing a plurality of semi-conducting materials, differentiated by their absorption spectra, and arranging the plurality of semi-conducting materials in a tandem arrangement. The arranging may include orienting the tandem arrangement with axial variation of the semiconductor materials.

In various embodiments, wrapping the optoelectronic cell about a central axis includes extending the cell around less than a complete turn about the axis. Alternatively, in various embodiments, wrapping the optoelectronic cell includes extending the photovoltaic device a complete turn about the axis. Yet alternatively, in various embodiments, wrapping the optoelectronic cell includes extending the optoelectronic cell circumferentially more than a complete turn around the tubular support so as to spiral the cell.

In various embodiments, wrapping the cell about a central axis may include wrapping the optoelectronic cell around a central support. Wrapping the optoelectronic cell around a central support may include providing a central support extending the photovoltaic cell circumferentially around a region of the central support.

In various embodiments, wrapping includes orienting the optoelectronic cell with the first conducting layer inward of the second conducting layer. Alternatively, wrapping may include orienting the optoelectronic cell with the second conducting layer inward.

In various embodiments, forming the flat panel cell may further include encapsulating at least a portion of the cell with an encapsulant. The encapsulant may be clay/polymer composite. Encapsulating at least a portion of the cell with an encapsulant may include coating the top conductive layer with the encapsulant. Alternatively, encapsulating at least a portion of the cell with an encapsulant may include dipping the cell in a solution of the encapsulant and drying the encapsulant.

In various embodiments, when forming the optoelectronic cell includes depositing a first conductive layer on a substrate and coating a second electrode with encapsulant, wrapping may include orienting the optoelectronic cell with the substrate inward of the encapsulant such that the layering of first electrode, semi-conductive layer, and second electrode is oriented outwardly. Alternatively, wrapping may include orienting the optoelectronic cell with the encapsulant inward of the substrate such that the layering of first electrode, semi-conductive layer, and second electrode is oriented inwardly.

In various embodiments, forming the optoelectronic cell may further include patterning the first conductive layer so as to form a plurality of first electrodes. Alternatively, or in combination, the optoelectronic cell may further include patterning the second conductive layer so as to form a plurality of second electrodes.

In any of the above embodiments, the optoelectronic devices may be photovoltaic devices. Alternatively, the optoelectronic devices may be organic light emitting diodes.

The foregoing has outlined rather broadly various features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following description to be taken in conjunction with the accompanying drawings describing specific embodiments of the disclosure, wherein.

DETAILED DESCRIPTION

Figure 1:
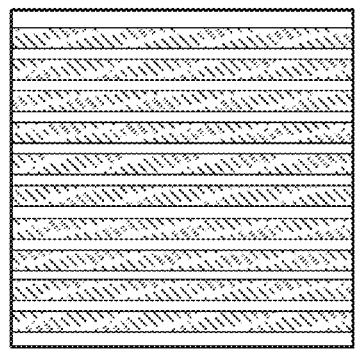
FIG. 1 shows a schematic of an etch pattern for Indium-Tin-Oxide (ITO) on a substrate.

In the following description, certain details are set forth such as specific quantities, concentrations, sizes, etc. so as to provide a thorough understanding of the various embodiments disclosed herein. However, it will be apparent to those of ordinary skill in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

Referring to the drawings in general, it will be understood that the illustrations are for the purpose of describing particular embodiments of the disclosure and are not intended to be limiting thereto. Furthermore, drawings are not necessarily to scale.

While most of the terms used herein will be recognizable to those of ordinary skill in the art, it should be understood that when not explicitly defined, terms should be interpreted as adopting a meaning presently accepted by those of ordinary skill in the art.

In various embodiments, the present invention relates to the design, architecture and fabrication of an all-organic, pixel tandem wrap cell. These new design and fabrication methods allow easier fabrication of tandem arrayed cells using a modified flat panel deposition technique. The outcome is a better control of the deposition of each layer; consequently forming mini-cell arrays that are sitting next to each other and individually connected to each other to make a macroscale solar cell. The arrays dimensions measure x by y (for about 1 μm>x> about 10 cm and about 1 μm>y> about 10 cm) and deposition controls are maximized to prevent short circuiting. These arrays can then be wrapped, which then forms a method of channeling light through all the different layers in the form of a tubular structure, enabling multiple organic layers to be used but in a linear fashion at a thickness that allows the excitons generated to deliver charges to the electrodes (which are made of organic layers having dimension of between about 40 nm to about 250 nm, depending on the mobility and conductivity of the organic layer), which then form multilayers with device specific dimensions to constitute the organic photovoltaic pixel tandem wrap cell. The dimensions of the wrap can have a radius of about 100 μm, or can be as wide as about 3 m, depending on how well the continued device fabrication process is managed, the thickness of the wrap is typically between about 1 μm and about 1 cm. The all-organic pixel tandem wrap cell may be used for a photovoltaic device. Alternatively, the all-organic pixel tandem wrap cell may be used for a light emitting diode.

In various embodiments of the optoelectronic devices, the optoelectronic devices absorb electromagnetic radiation including, for example, infrared radiation, visible radiation, ultraviolet radiation and combinations thereof. In various other embodiments of the optoelectronic devices, the optoelectronic devices emit electromagnetic radiation including, for example, infrared radiation, visible radiation, ultraviolet radiation and combinations thereof.

In various embodiments of the optoelectronic devices, the band gap of the semi-conductive layer is from about 1.1 eV to about 2.0 eV. Such a band gap is comparable to that present in a contemporary solar cell devices utilizing silicon.

In any of the various embodiments of the optoelectronic devices and methods for production thereof described herein, the support may include a material such as, for example, glass, quartz, polymers (e.g. plastic optical fibers), and metals. Polymers suitable for making plastic optical fibers include, for example, polymethyl methacrylate and perfluorocyclobutane-containing polymers.

In any of the various embodiments of the optoelectronic devices and methods for production thereof described herein, a layer of the optoelectronic device can further include at least one upconverter. As used herein, an upconverter is a material operable to emit electromagnetic radiation at an energy greater than that absorbed by the upconverter. For example, upconverters of the present disclosure can absorb infrared radiation and emit visible or ultraviolet radiation. In various embodiments, upconverters of the present disclosure can include at least one lanthanide element such as, for example, erbium, ytterbium, dysprosium, holmium, and combinations thereof. In other various embodiments, upconverters that are organic compounds are disclosed. Such upconverting organic compounds include, for example, 1,8-naphthalimide derivatives, 4-(dimethylamino)cinnamonitrile (cis and trans), trans-4-[4-(dimethylamino)styryl]-1-methylpyridinium iodide, 4-[4-(dimethylamino)styryl)pyridine, 4-(diethylamino)benzaldehyde diphenylhydrazone, trans-4-[4-(dimethylamino)styryl]-1-methylpyridinium p-toluenesulfonate, 2-[ethyl[4-(nitrophenyl)ethenyl]phenylamino]ethanol, 4-dimethylamino-4'-nitrostilbene, Disperse Orange 25, Disperse Orange 3 and Disperse Red 1. In still other various embodiments, upconverters that are quantum dots are disclosed. Quantum dots include semiconductor materials such as, for example, cadmium selenide, cadmium telluride, zinc selenide, lead sulfide, cadmium sulfide, lead selenide, cadmium selenide, tellurium nanorods and selenium spheres.

In any of the various embodiments of the optoelectronic devices and methods for production thereof described herein, the first conductive layer includes a conducting oxide such as, for example, indium tin oxide (ITO), gallium tin oxide, zinc indium tin oxide and combinations thereof. In various embodiments, the first electrode layer is ITO. In other various embodiments, the first conductive layer includes a conducting polymer such as, for example, poly(acetylene)s, poly(pyrrole)s, poly(thiophene)s, poly(aniline)s, poly(parapyridine)s, poly(fluorene)s, poly(3-alkylthiophene)s, poly(tetrathiafulvalene)s, poly(naphthalene)s, poly(p-phenylene sulfide)s, poly(para-phenylene vinylene)s, and poly(para-pyridyl vinylene)s. In various embodiments, the first conductive layer includes polyaniline. In various embodiments, the first conductive layer includes poly(3,4-ethylenedioxythiophene) (PEDOT). In various embodiments, optional charge carriers or dopants (n- or p-type) can be added to the conducting polymers to increase their conductivity.

In still other various embodiments, the first conductive layer can include a conductive composite material. For example, the conductive composite material can include carbon nanotubes, fullerenes and combinations thereof dispersed in a polymer phase to make the composite material conductive. In some embodiments, the polymer phase of the composite material is non-conductive, while in other embodiments, the polymer phase is conducting prior to including the carbon nanotubes or fullerenes. In still additional various embodiments, the first conductive layer can be a metal or metal alloy. According to some embodiments, the first conductive layer can include one or more of gold and silver.

The first conductive layer can have thickness of about 10 nm to about 1 µm in some embodiments, about 100 nm to about 900 nm in other embodiments, and about 200 nm to about 800 nm in still other embodiments.

In various embodiments of the optoelectronic devices and methods for production thereof described herein, the semi-conductive layer is formed from at least two polymer-based semi-conductive materials. In various embodiments, the at least two semi-conductive materials each include a polymer and a filler material. In some embodiments, the polymer is a p-type material and the filler is an n-type material. One of ordinary skill in the art will recognize that the absorption profile of the optoelectronic devices may be tuned to various parts of the electromagnetic spectrum based on a knowledge of the absorption profiles of the at least two semi-conductive materials. In various embodiments, the filler material is used to tune the absorption properties of the optoelectronic devices. Furthermore, the filler material may also influence the electron transport properties within the optoelectronic devices.

In various embodiments, the polymer of the at least two polymer-based semi-conductive materials can be, for example, poly(acetylene)s, poly(pyrrole)s, poly(thiophene)s, poly(aniline)s, poly(parapyridine)s, poly(fluorene)s, poly(3-alkylthiophene)s, poly(tetrathiafulvalene)s, poly(naphthalene)s, poly(p-phenylene sulfide)s, poly(para-phenylene vinylene)s, poly(para-pyridyl vinylene)s and combinations thereof. In some embodiments, the polymer can be, for example, poly(3-hexylthiophene) ($P_3HT$), poly(3-octylthiophene) ($P_3OT$), poly[2-methoxy-5-(2'-ethylhexyloxy-p-phenylene vinylene)] (MEH-PPV), poly[2-methoxy-5-(3,7-dimethyloctyloxy)-p-phenylene vinylene], sodium poly[2-(3-thienyl)-ethoxy-4-butylsulfonate] (PTEBS) and combinations thereof. In some embodiments, the polymer can be a co-polymer such as, for example, poly[(m-phenylene vinylene)-co-(2,5-dioctyloxy-p-phenylene vinylene)] (PmPV). PmPV is particularly advantageous due to its propensity for forming well dispersed carbon nanotube polymer composites.

In any of the various embodiments of the photovoltaic devices and methods for production thereof described herein, the filler material of the polymer-based semi-conductive materials can include, for example, carbon nanotubes, fullerenes, quantum dots and combinations thereof. In various embodiments, the filler material is carbon nanotubes. Further description of the carbon nanotubes is set forth hereinbelow. In various embodiments, the filler material is a fullerene material. Illustrative fullerene materials include, for example, $C_{60}$, $C_{70}$ and higher fullerenes $C_{76}$, $C_{78}$, $C_{82}$ and $C_{84}$. Derivatized fullerenes such as, for example, 1-(3-methoxycarbonyl)propyl-1-phenyl(6,6)-$C_{71}$ (PCBM-$C_{70}$) and 1-(3-methoxycarbonyl)propyl-1-phenyl(6,6)-$C_{71}$ (PCBM-$C_{70}$) may be used as a filler material in various embodiments of the present disclosure. In some embodiments of the disclosure, PCBM-$C_{70}$ is particularly advantageous due to the better photoconductive properties of $C_{70}$ relative to that of $C_{60}$, in addition to its smaller bandgap and lower propensity to fluoresce. In various embodiments, the filler material is a quantum dot material. Illustrative quantum dot compositions for the filler material include, for example, lead sulfide, cadmium telluride, cadmium sulfide, lead selenide, cadmium selenide, tellurium nanorods and selenium spheres.

In various embodiments, the at least two semi-conductive materials are both nanocomposites. In some embodiments, a first semi-conductive material is a $P_3HT$:PCBM $C_{70}$ nanocomposite and a second semi-conductive material is a nanocomposite of PmPV doped with carbon nanotubes.

In any of the various embodiments described herein, carbon nanotubes may be formed by any known technique and can be obtained in a variety of forms, such as, for example, soot, powder, fibers, bucky paper and mixtures thereof. The carbon nanotubes may be any length, diameter, or chirality as produced by any of the various production methods. In some embodiments, the carbon nanotubes have diameters in a range between about 0.1 nm and about 100 nm. In some embodiments, the carbon nanotubes have lengths in a range between about 100 nm and about 1 µm. In some embodiments, the chirality of the carbon nanotubes is such that the carbon nanotubes are metallic, semimetallic, semiconducting or combinations thereof. Carbon nanotubes may include, but are not limited to, single-wall carbon nanotubes (SWNTs), double-wall carbon nanotubes (DWNTs), multi-wall carbon nanotubes (MWNTs), shortened carbon nanotubes, oxidized carbon nanotubes, functionalized carbon nanotubes, purified carbon nanotubes, and combinations thereof. One of ordinary skill in the art will recognize that many of the embodiments described herein using a particular type of carbon nanotube may be practiced within the spirit and scope of the disclosure using other types of carbon nanotubes.

In any of the various embodiments presented here, the carbon nanotubes may be unfunctionalized or functionalized. Functionalized carbon nanotubes, as used herein, refer to any of the carbon nanotube types bearing chemical modification, physical modification or combination thereof. Such modifications can involve the nanotube ends, sidewalls, or both. Illustrative chemical modifications of carbon nanotubes include, for example, covalent bonding and ionic bonding. Illustrative physical modifications include, for example, chemisorption, intercalation, surfactant interactions, polymer wrapping, solvation, and combinations thereof. Unfunctionalized carbon nanotubes are typically isolated as aggregates and are referred to as ropes or bundles, which are held together through van der Waals forces. The carbon nanotube aggregates are not easily dispersed or solubilized. Chemical modifications, physical modifications, or both can provide individualized carbon nanotubes through disruption of the van der Waals forces between the carbon nanotubes. As a result of disrupting van der Waals forces, individualized carbon nanotubes may be dispersed or solubilized.

In various embodiments, functionalized carbon nanotubes are functionalized with organic dyes that absorb in the infrared, visible, or ultraviolet region of the electromagnetic spectrum, or a combination thereof. Such functionalized carbon nanotubes advantageously provide for charge transfer from the non-conducting dye medium to the carbon nanotubes, which are conducting. Hence, enhanced absorption of electromagnetic radiation and conversion to electricity can be realized using dye-functionalized carbon nanotubes in the optoelectronic devices.

Unfunctionalized carbon nanotubes may be used as-prepared from any of the various production methods, or they may be further purified. Purification of carbon nanotubes typically refers to, for example, removal of metallic impurities, removal of non-nanotube carbonaceous impurities, or both from the carbon nanotubes. Illustrative carbon nanotube purification methods include, for example, oxidation using oxidizing acids, oxidation by heating in air, filtration and chromatographic separation. Oxidative purification methods remove non-nanotube carbonaceous impurities in the form of carbon dioxide. Oxidative purification of carbon nanotubes using oxidizing acids further results in the formation of oxidized, functionalized carbon nanotubes, wherein the closed ends of the carbon nanotube structure are oxidatively opened and terminated with a plurality of carboxylic acid groups. Illustrative oxidizing acids for performing oxidative purification of carbon nanotubes include, for example, nitric acid, sulfuric acid, oleum and combinations thereof. Oxidative purification methods using an oxidizing acid further result in removal of metallic impurities in a solution phase. Depending on the length of time oxidative purification using oxidizing acids is performed, further reaction of the oxidized, functionalized carbon nanotubes results in shortening of the carbon nanotubes, which are again terminated on their open ends by a plurality of carboxylic acid groups. The carboxylic acid groups in both oxidized, functionalized carbon nanotubes and shortened carbon nanotubes may be further reacted to form other types of functionalized carbon nanotubes. For example, the carboxylic acid groups may be reacted with organic dye molecules.

While the above-described semi-conductive materials are particularly suitable when the optoelectronic device is a photovoltaic device, it will be understood that the semi-conductive layer may be selected to contain one or more semi-conductive materials according to the application of the optoelectronic device as a photovoltaic device or an organic light emitting diode. Suitable light emitting diode materials include, for example, derivatives of organic-metallic chelates such as tris-(8-hydroxyquinoline)aluminum ($Alq_3$) and tris-[2-(p-tolyl)pyridine]iridium(III) [$Ir(mppy)_3$] and derivatives of poly(phenylene vinylene) and polyfluorene.

In any of the various embodiments of the optoelectronic devices and methods for production thereof described herein, the second conductive layer is formed from a metal or metal alloy. In various embodiments, the second electrode is formed from a material such as, for example, gold, silver, copper, aluminum and combinations thereof. In some embodiments, the second electrode layer is aluminum. The second electrode may have a thickness ranging from about 10 nm to about 10 µm in some embodiments, from about 100 nm to about 1 µm in other embodiments, and from about 200 nm to about 800 nm in still other embodiments.

In any of the various embodiments of the optoelectronic devices and methods for production thereof described herein, the photovoltaic devices may further include a LiF layer between the semi-conductive layer and the second electrode. In some embodiments, the thickness of the LiF layer is about 5 angstroms to about 10 angstroms. In some embodiments, the LiF layer is less than about 5 angstroms in thickness. LiF enhances the efficiency of energy conversion in the optoelectronic devices. In some embodiments, the LiF layer is at least partially oxidized to form a layer of mixed LiF and $Li_2O$. In some embodiments, the LiF layer is completely oxidized to $Li_2O$.

In any of the various embodiments of the optoelectronic devices and methods for production thereof described herein, the photovoltaic devices further include an exciton-blocking layer between the first conducting layer and the semi-conductive layer. In various embodiments, the exciton-blocking layer is a carbon nanotube-polymer composite. In some embodiments, the exciton-blocking layer is semi-conductive. In various embodiments, the exciton-blocking layer assists in the band bending process between the bottom conductive layer and the semi-conductive layer. In various embodiments, the exciton-blocking layer limits the path length over which excitons can diffuse. In various embodiments, the exciton-blocking layer may additionally act to fill pinhole gaps or shorting defects in the bottom conductive layer.

In various embodiments, the exciton-blocking layer is formed from a polystyrenesulfonate/carbon nanotube polymer composite (PSS/nanotube composite). In the PSS/nanotube composite, a styrenesulfonate monomer is attached to a dithiocarboxylic ester-functionalized carbon nanotube, and the appended styrenesulfonate is then polymerized to form the PSS/nanotube composite. In such embodiments, the carbon nanotubes are chemically bonded to the polymer matrix. In some embodiments, the carbon nanotubes of the PSS/nanotube composite are MWNTs. In some embodiments, the carbon nanotubes of the PSS/nanotube composite are SWNTs.

In other various embodiments, the exciton-blocking layer is formed from a composite material having carbon nanoparticles dispersed in a 3,4-polyethylenedioxythiophene: polystyrenesulfonate copolymer or a poly(vinylidene chloride) polymer or copolymer. In various embodiments, the carbon nanoparticles are, for example, SWNTs, MWNTs, fullerenes and combinations thereof.

In any of the various embodiments of the optoelectronic devices and methods for production thereof described herein, the photovoltaic devices may further include a protective layer coating the second conductive layer. The protective layer is herein termed encapsulant. In some embodiments, the protective layer is a polymeric material such as, for example, parlene or epoxy resin. In some embodiments, the protective layer is a composite material, for example, a clay/polymer composite. The protective layer provides increased durability to the optoelectronic devices and inhibits oxidative degradation of the optoelectronic device components.

In other various embodiments of the present disclosure, photovoltaic collectors are described. The photovoltaic collectors include a plurality of photovoltaic devices that are in electrical contact with an output circuit.

In various embodiments of the photovoltaic collectors, the plurality of optoelectronic devices includes at least about 1,000 optoelectronic devices. In other various embodiments of the photovoltaic collectors, the plurality of optoelectronic devices includes at least about 10,000 optoelectronic devices. In some embodiments, the output circuit includes a battery. In some embodiments, the output circuit includes electrical wiring.

Any of the various layers of the optoelectronic devices described herein may be deposited by any known deposition technique. For example, the layers may be deposited through techniques such as, for example, sputtering, dip coating, spin coating, vapor phase deposition, vacuum thermal annealing, and combinations thereof.

In other various embodiments, methods for preparing optoelectronic devices are disclosed. The methods include the steps of: forming an optoelectronic cell while flat, and wrapping the optoelectronic cell around a central axis.

In various embodiments, forming the optoelectronic device unit includes depositing a first conductive layer over a substrate, depositing at least one semi-conductive layer over the first conductive layer, and depositing a second conductive layer over the semi-conductive layer. Forming the optoelectronic device unit may further include patterning the first conductive layer so as to form a plurality of first electrodes. Forming the cell may further include encapsulating at least a portion of the cell with an encapsulant. The encapsulant may be clay/polymer composite. Depositing at least a portion of the cell with an encapsulant may include coating the top conductive layer with the encapsulant. Alternatively, encapsulating at least a portion of the cell with an encapsulant may include dipping the cell in a solution of the encapsulant and drying the encapsulant.

In various embodiments, wrapping the optoelectronic cell around a central axis includes extending the optoelectronic cell circumferentially about the central axis. When forming the optoelectronic cell includes depositing a first conductive layer on a substrate and coating a second electrode with encapsulant, wrapping may include orienting the optoelectronic cell with the substrate inward of the encapsulant such that the layering of first electrode, semi-conductive layer, and second electrode is oriented outwardly from the support. Alternatively, wrapping may include orienting the optoelectronic cell with the encapsulant inward of the substrate such that the layering of first electrode, semi-conductive layer, and second electrode is oriented inwardly towards the support.

In various embodiments, wrapping the optoelectronic cell includes extending the optoelectronic cell circumferentially less than a complete turn about the central axis. Alternatively, in various embodiments, wrapping the photovoltaic device unit includes extending the optoelectronic cell circumferentially a complete turn. Yet alternatively, in various embodiments, wrapping the optoelectronic cell includes extending the photovoltaic device circumferentially more than a complete turn about the central axis so as to spiral the photovoltaic device unit around a region of the support.

The following examples are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLES

The following examples illustrate the design, architecture and fabrication method for the construction of the present invention, namely the organic photovoltaic pixel tandem wrap cell.

Example 1

Patterning and cleaning Indium Tin Oxide (ITO) coated glass.

Patterning. The ITO coated glass was patterned by controlled etching using scotch tape as a masking material to form separated mini electrodes or mini-cell areas. The part of the coated substrate which formed the electrodes was covered with scotch tape to prevent etching. 2.5 mm wide ITO stripes with a gap of 1.2 mm were etched as depicted in FIG. 1. FIG. 1 shows a schematic of the etch pattern for ITO on a substrate. Grey zones indicate 2.5 mm wide ITO stripes and white zones indicate 1.02 mm wide gaps without ITO (Not to scale). However it will be understood that the dimensions of the strips (active area of the cell) and the gap between them can be adjusted to suit the device requirements. Further, the etching can leave lines as small as 1 µm. Thus, for example, the ITO stripes and the gaps can be varied from 1 µm to 1 cm.

Figure 2A:
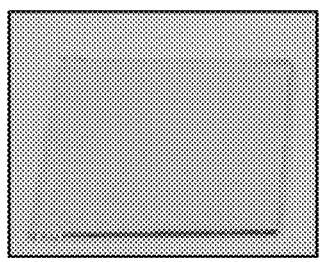
FIG. 2A shows a photograph of an ITO coated glass substrate.
Figure 2B:
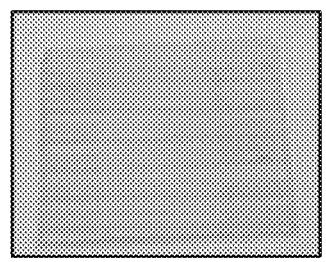
FIG. 2B shows a photograph of a masked ITO glass substrate.
Figure 2C:
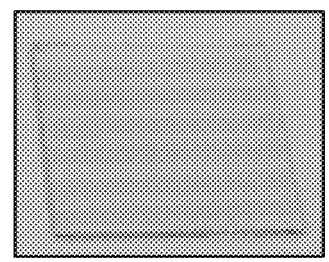
FIG. 2C shows a photograph of an etched ITO glass substrate.

The etching procedure for ITO coated glass was carried out as follows. 2.5 mm wide long strips of scotch tape are glued onto the ITO coated glass slides. Zinc powder is spread over the masked slide to cover the entire surface. The samples are then immersed in 18% HCl solution for approximately 5 to 10 seconds. After etching, the samples are immediately rinsed in water. The scotch tape is removed and the samples are washed using acetone. Finally the samples are dried with nitrogen. FIGS. 2A-C shows a photograph of (a) ITO coated glass substrate (FIG. 2A), (b) masked ITO glass substrate (FIG. 2B), and (c) etched ITO glass substrate (FIG. 2C).

Cleaning. After etching, samples are cleaned sequentially using 1.5% Micro90® detergent solution, water and isopropanol in an ultrasonic bath for 15 minutes each. In the end samples are dried with nitrogen.

Example 2

Patterning ITO coated PET sheets.

Patterning. The etching procedure to pattern ITO coated PET sheets was similar to that of etching glass substrate, as described in Example 1. The etching was carried out as follows. 2.5 mm wide long strips of scotch tape are glued onto the ITO coated PET sheet. Zinc powder was spread over the masked slide to cover the entire surface. The samples were then immersed in 9% HCl solution for approximately 1 min. After etching, the samples were immediately rinsed in water. The scotch tape was removed and the samples were washed using iso-propanol. Finally the samples were dried with nitrogen.

Cleaning. After etching, samples were cleaned sequentially using 1.5% Micro90® detergent solution in ultrasonic bath for 5 minutes and then in water and isopropanol in ultrasonic bath for 10 minutes each. In the end samples were blown dried with nitrogen.

Example 3

Plastic substrates with patterned gold as the first electrodes.

Semi-transparent conducting gold electrodes can also be used as the first electrodes instead of ITO. The plastic sheets for gold electrodes are patterned as follows. The pattern was first printed onto a transparent plastic substrate. Although PET was used for the transparent plastic substrate, it will be understood that other suitable polymer sheets may be used. The thickness of ink lines could be varied from 200 μm to 2.5 mm when using a commercial inkjet printer using a water-based ink, or 40 to 60 μm using a JETLAB 4 Microprinting System with poly(3,4-ethylenedioxythiophene):poly(styrenesulfonate) (PEDOT:PSS) solutions. A semi-transparent conducting layer of gold (~20 nm thick and resistance ~10 ohms) was sputtered on to an appropriate sized printed transparent sheet using Denton V at 15 mA for 2 minutes. Alternatively, a semi-transparent conducting layer of gold (~20 nm thick and resistance ~5 ohms) were thermally evaporated successive layers of chromium (Cr, 99.998%, Kurt Lesker) and Au (99.999%, Kurt Lesker) (~20 nm) through a shadow mask onto the cleaned plastic substrate at a pressure of <$10^{-6}$ mbar. After deposition, the ink was washed away under running tap water. Thin strips of gold were left behind, according to the pattern printed or the shadow mask. The gold patterned plastic sheet was then washed with isopropanol and dried with nitrogen.

Glass substrates for gold electrodes were patterned as follows. This procedure can be adjusted for patterning a plastic substrate. The first step of the fabrication process was the cleaning of the microscope cover-glass substrates (Fisher). They were cleaned in an ultra-sonic bath using 1.75% micro-90 solution (10 minutes), water (15 minutes) and isopropanol (IPA) (15 minutes) consecutively and dried using nitrogen. Successive layers of chromium (Cr, 99.998%, Kurt Lesker) and Au (99.999%, Kurt Lesker) (~20 nm) were thermally evaporated through a shadow mask onto the cleaned glass slides at a pressure of <$10^{-6}$ mbar. The deposition was done using a one-filament system and vacuum was broken between deposition of Cr and Au. Two separate tungsten wire baskets were used to prevent cross-contamination of the metals.

Figure 2D:
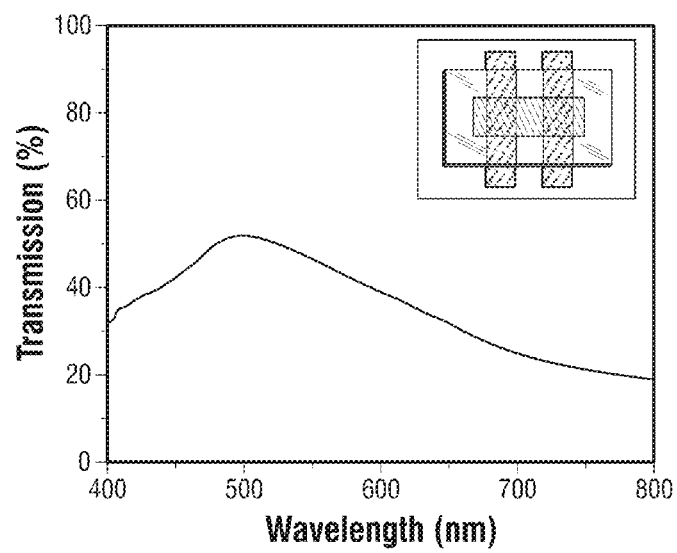
FIG. 2D shows the optical transmittance of an Au film with a sheet resistance of 5.19Ω/□. Inset: A picture of a glass slide with a semi-transparent Au electrode.
Figure 2E:
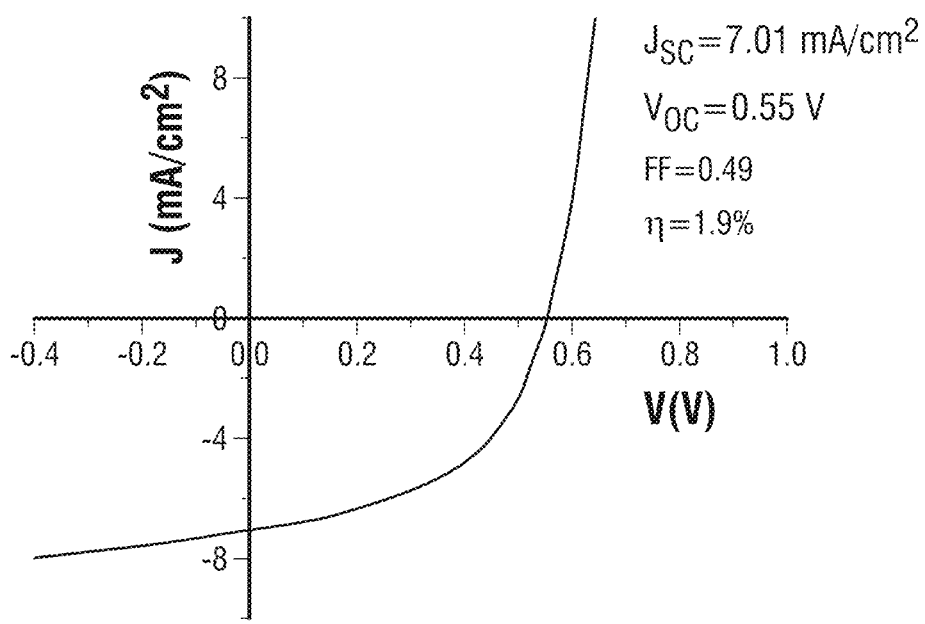
FIG. 2E shows the current density-voltage (J-V) characteristics of a Au anode OSC under illumination with intensity of 100 mW/cm$^2$.

The Au covered glass substrates were dipped in IPA and blow-dried with nitrogen to remove any dust particles. They were treated by ozone plasma for 20 minutes before spin-coating a thin layer of electron blocking PEDOT:PSS (Clevios PH750, H. C. Starck), filtered through a 0.45 μm Corning membrane filter. The substrates were dried in an oven at 100° C. for 1 hour in a nitrogen atmosphere. A thin layer of photo-active material was spin-coated onto the substrates before drying them again in an oven under the same conditions. The photo-active material was prepared using a donor/acceptor blend of regioregular poly(3-hexylthiophene): phenyl-$C_{61}$-butyric acid methyl ester (P3HT: PCBM) (Aldrich) with a weight ratio of 1 to 0.68 and a concentration of 12 g/L in anhydrous chlorobenzene solution. Thermally evaporated aluminum electrodes were deposited through a shadow mask, at a pressure of <$10^{-6}$ mbar. Immediately after Al deposition, the devices were encapsulated with glass slides and epoxy resin in a nitrogen filled glove box (~10% relative humidity). FIG. 2D shows the optical transmittance of an Au film with a sheet resistance of 5.19Ω/□. Inset: A picture of a glass slide with a semi-transparent Au electrode. FIG. 2E shows the current density-voltage (J-V) characteristics of a Au anode OSC under illumination with intensity of 100 mW/cm$^2$.

Example 4

UV/Ozone plasma treatment.

In order to improve adhesion of the coatings, cleaned samples, such as prepared according to Examples 1-3, were treated with UV/Ozone plasma (Novascan, digital UV/Ozone system) for 5-10 minutes.

Example 5

Deposition of polymer layers.

One of the purposes of the present invention is to deposit an organic semiconductor layer and form a diode structure, and this can be in the form of a Schottky device, heterojunction, hybrid composite or p-n device. The organic semiconductor is the active photo material in the solar cell which generates the excitons. The deposition of these layers can be done using spray coating, spin coating, printing or a form of drop casting. Described in the next section is the basic single polymer deposition layer.

At first, a layer of poly(3,4-ethylenedioxythiophene):poly(styrenesulfonate) (PEDOT:PSS) (1.3 wt % dispersed in $H_2O$) was spin coated onto the patterned substrate. The spin speed was varied from 500 rpm to 3000 rpm depending on the concentration of the solution. The samples were allowed to dry completely in nitrogen at room temperature before depositing the next layer of photoactive material. The coating solution for this particular layer and its constituents were prepared by dissolving different concentrations of regioregular $P_3HT$ and PCBM in chlorobenzene.

Figure 3A:
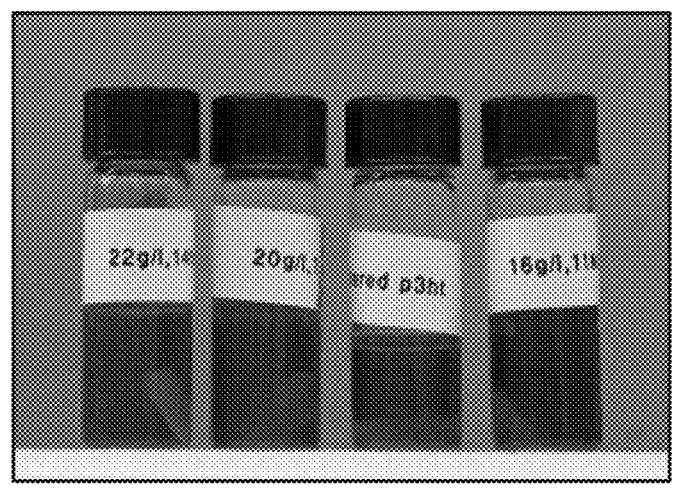
FIG. 3A shows a photograph of solutions of photoactive material at various concentrations ready for spin coating.
Figure 3B:
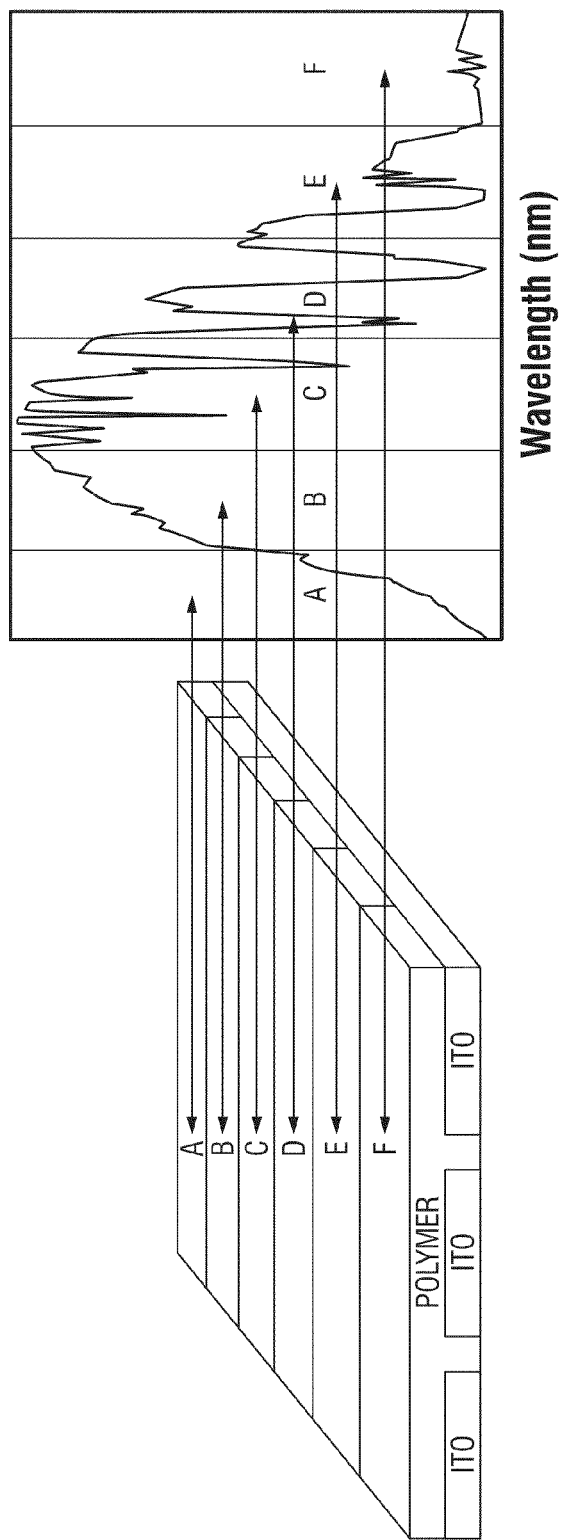
FIG. 3B shows a depiction of an array of semiconductors that are deposited in a tandem array.

Different solution concentrations ranging from 14 g/l to 25 g/l were used as shown in FIG. 3A. FIG. 3A shows solutions of photoactive material (in here, $P_3HT$) at various concentrations (from 16 to 22 g/l) in chlorobenzene ready for spin coating. Solution concentration of the photoactive material was managed to deliver the optimum thickness of the active layer. That optimum thickness is dependent on the conductivity, mobility, and interface interactions of the active layers as well as the deposition technique used, including but not limited to spin coating, dr blading, printing, evaporation or sputtering. The deposition of the array of semiconductors can be done using a range of techniques, where applicable such as spin coating, printing, dr blading, drop coating, spray deposition, evaporation, sublimation, Langmuir-Blodgett, monomer to polymer growth. The spin speed was increased from 500 rpm to 3000 rpm as the concentration of the coating solution was decreased. In classical semiconductor phraseology, a p-type organic semiconductor such as poly(3-hexylthiophene)(P3HT) was used to form a simple schottky device, although an n-type semiconductor such as phenyl-$C_{61}$-butyric acid methyl ester (PCBM) can be added to form a heterojunction. But the devices are not limited to these materials (other p and n type organic semiconductors can be used) as well as the solvent used to make the solutions (other suitable organic solvents can be used). The photoactive layers can also be a hybrid material which can consist of a semiconducting polymer host with either a nanorod, quantum dot, or isolated quantum well structure as illustrated in FIG. 3B. Shown in FIG. 3B is an array of tandem cells, each semiconductor as an example has a spectral overlap and maximum absorption at specific areas of the solar spectrum. In this way, the array of cells can be designed so that a greater overlap of the solar spectrum is achieved. While no single semiconductor can do this, a group of semiconductors in the array, when lined up in this manner, absorb more of the spectrum and so increase the efficiency of the cells.

Example 6

Fabrication of the Second electrode.

Figure 4A:
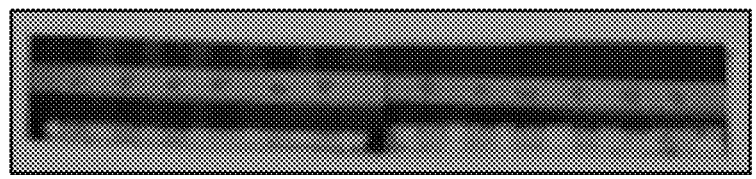
FIG. 4A shows a sample of a flat panel pixel tandem cell prior to wrapping after the deposition of an aluminum second conductive layer.
Figure 4B:
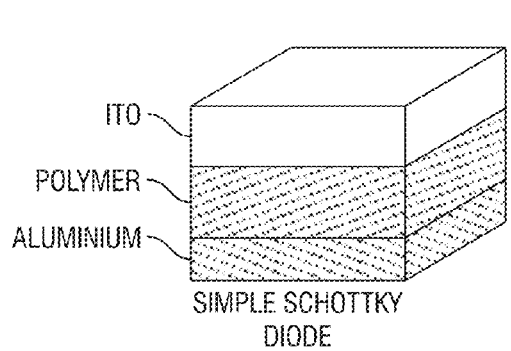
FIGS. 4B-4D show different configurations for optoelectronic devices using organic semiconductors as the active materials.
Figure 4C:
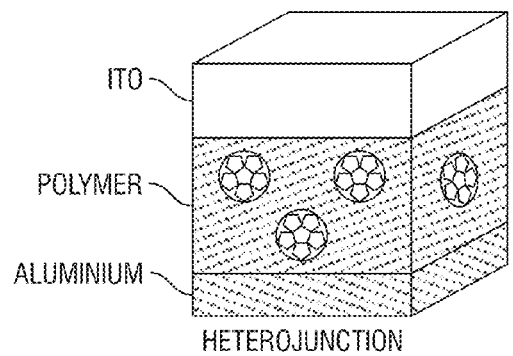
Figure 4D:
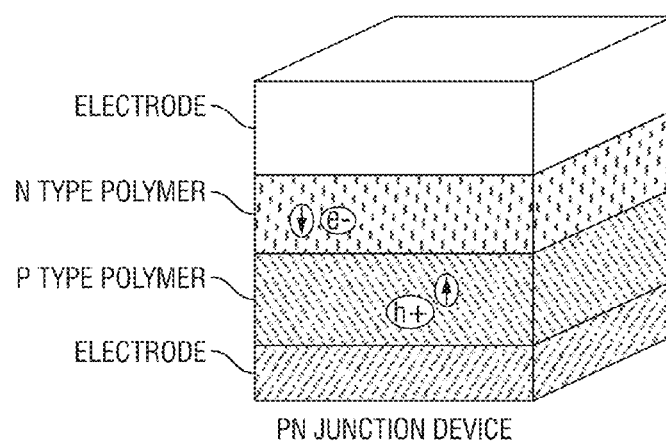

A top aluminum electrode was evaporated by a sputtering technique at a pressure less than $10^{-6}$ mbar. The deposition rate was increased gradually to get a >100 nm thick aluminum electrode. It will be understood that other low workfunction electrodes can also be used. FIGS. 4A and 4B each show a sample of the flat panel pixel tandem cell prior to wrapping after the deposition of an aluminum second electrode. FIG. 4A is a solar cell after the deposition of the second electrode. For photovoltaic application, exemplary metals are Ca and Al, although these can be otherwise defined by a mix of low workfunction and high workfunction materials, some of which can be alloys. Different deposition techniques such as sputtering, thermal evaporation, printing, lithography, doctor blading can also be adapted to fabricate the second electrode i.e. cathode. FIG. 4B shows examples of various configurations for photovoltaics using organic semiconductors as the active materials. FIGS. 4A and 4B illustrate how pixel arrays of organic photovoltaics can be made. When contacting, those that have defects (pinholes) can be disconnected from the rest, maintaining an overall higher performance cell. Different configurations can also be formed, whether it is a heterojunction, Schottky diode, p-n junction and in some cases using the organic polymer as a host in a composite hybrid architecture.

Example 7

Testing of Flat Panel Pixel Cell Arrays.

Figure 5:
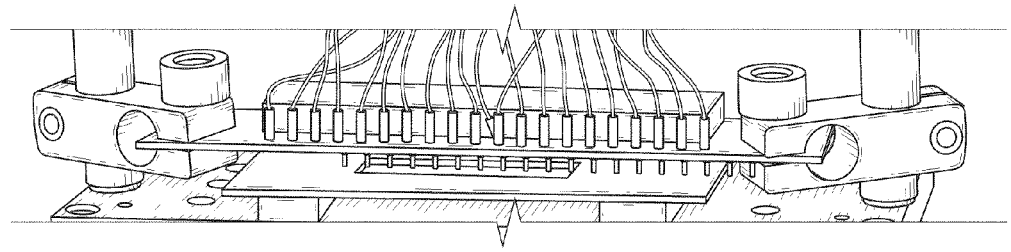
FIG. 5 shows a photograph of a prototype probe-head.

In order to test for any electrically shorted devices (where there is a low resistance, i.e. an electrical connection between the anode and the cathode of the solar cell) a probe head was designed (FIG. 5). FIG. 5 depicts a prototype probe-head containing 20 probe-tips. Each one of the 20 white wires was connected to a spring loaded contact which serves as a probe tip for the anode of each pixel device to be tested. A spring loaded contact with a relatively large surface area was chosen so as not to damage the devices when making electrical contact. The black wire was also connected to a spring loaded contact making an electrical contact in a similar fashion to the common cathode. It will be understood that the number of probe-tips depends on the number of devices made; and therefore size of the macro area to be examined. They can be measured as a single system or as multiple heads for more than one layer of testing.

Figure 6A:
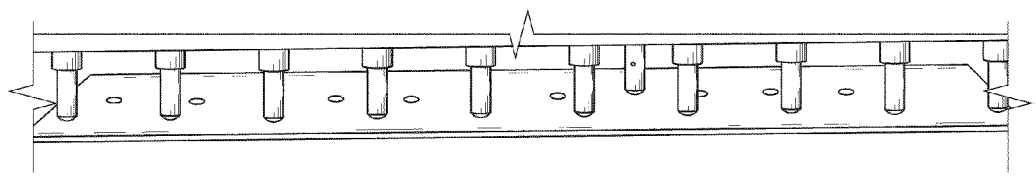
FIG. 6A shows a probe-head in contact with a prototype flat panel pixel array device.
Figure 6B:
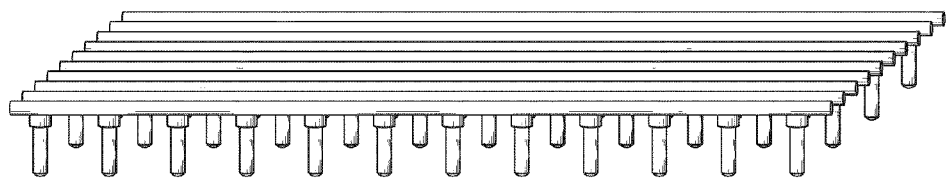
FIG. 6B shows a device with multiple probe-heads combined.

An exemplary probe-head has an array of 'n' spring loaded probe-tips whose layout mirrors that of each pixel device anode and the common cathode (FIGS. 6A and 6B). FIG. 6A depicts a zoomed-in view of a probe-head in contact with an actual proto-type device. It displays how the probe-tips simultaneously make contact with many pixel devices in a single array. The concept of this device is scalable—the number of devices—'n' to be tested can realistically be scaled to n=240 using commercially available product solutions. More heads put together can test more devices simultaneously, making the process more efficient as shown in FIG. 6B.

Figure 7:
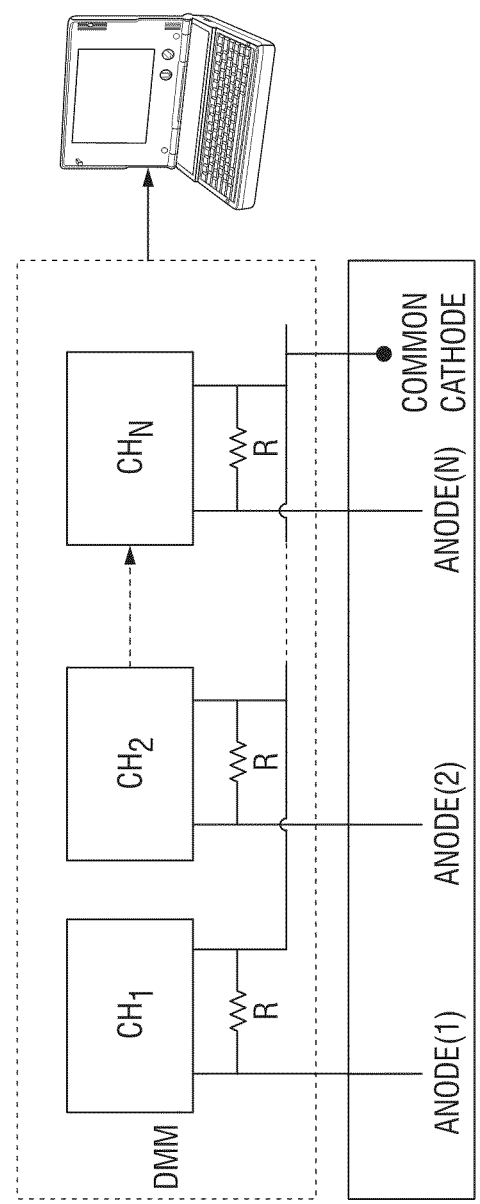
FIG. 7 shows an electrical connection diagram for a multiplexer integrated in a digital multimeter.

The probe-tips were connected to a 'Multiplexer Module' in such a way that it allowed a highly resistive electrical path of known resistance between each individual device's anode and the common cathode (FIG. 7). FIG. 7 is a simplified circuit diagram showing how each channel in the Multiplexer used is connected in relation to the probe-tips. This is how a known resistance can be applied across the High and Low inputs of each channel which also corresponds to the anode and cathode of each pixel device.

Figure 8A:
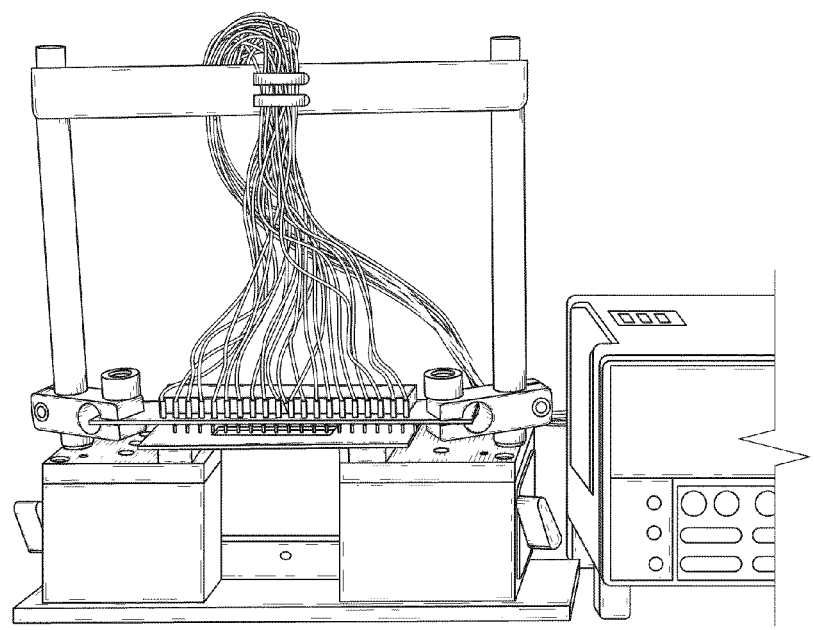
FIG. 8A shows a probe test device connected to a digital multimeter with an integrated multiplexer module.
Figure 8B:
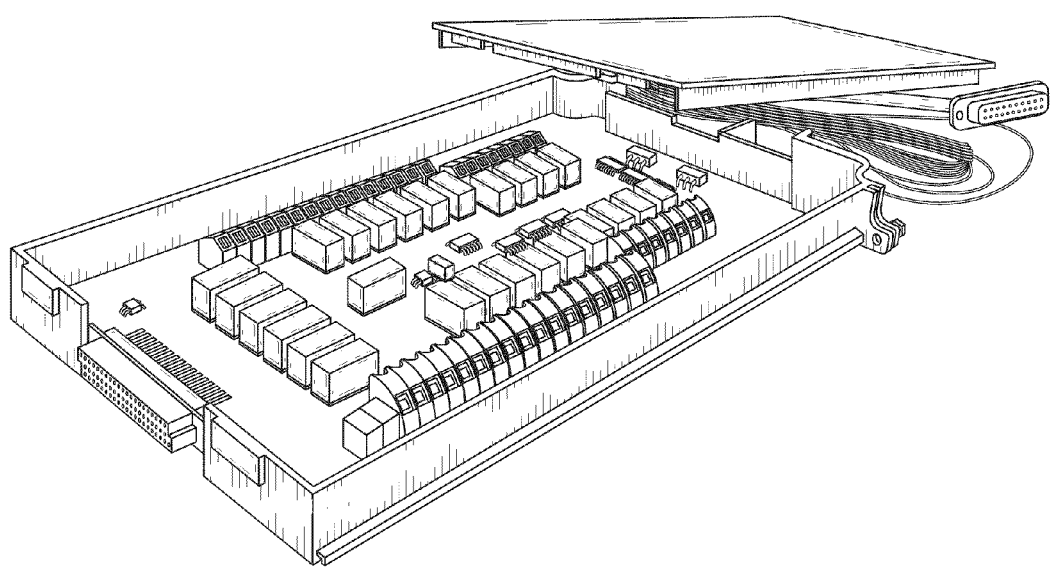
FIG. 8B shows a multiplexer wired up.

This Multiplexer was integrated into a Keithley 2700 Integra Series Integrated Switching/Measurement/Datalogging System (DMM) (FIG. 8A and FIG. 8B) which is computer controlled via USB GPIB interface. FIG. 8A depicts the entire probe-head testing rig and a Keithley Device. FIG. 8B depicts an open Multiplexer card. This card was placed inside the Keithley DMM once the relevant electrical connections and resistors had been put in place as shown. It was possible to instruct the DMM to measure the resistance between each anode/common cathode combination. Using the DMM manufacturer's software or a suitable user written program, a table of data for the wrap array was displayed on screen showing the results of the test. A device that exhibits an out of tolerance or low resistivity (caused by an electrical short resulting in a low resistance in parallel to the known resistance) was a failed device. In general, failed devices subsequently have to be electrically isolated from the other devices in the pixel device array.

With the addition of an appropriate Source Meter connected to this setup it was also possible to characterise the performance of each individual pixel cell. This could be accomplished by triggering the Source-meter from the DMM. For every device (channel) the DMM scans through, it triggers the source-meter and waits for it to run a Current-Voltage (I-V) Curve measurement. These devices could be controlled using LabView or similarly by other appropriate programming languages. It is possible to display graphically or in tabulated data each I-V Curve for each pixel device.

Example 8

Electrical Isolation of failed devices.

Devices that failed the electrical testing process and ones which exhibit an abnormal I-V Curve that they will hinder the overall performance of the final device were selected to be removed from the pixel array. This could be achieved by either removing their electrical connection/track line from the substrate or by cutting a small slot out of the substrate along part of this track. This process may be integrated into the electrical probe-head assembly as part of a quality control process.

Example 9

Deposition of the Electrode Interconnectors.

Following the isolation of any failed or badly defective devices from the pixel cell array, a first electrode interconnector was fabricated. This could be achieved by applying a conductive paste or other suitable conducting material across the patterned first electrodes to form the interconnected first electrode. This process may also be carried out by evaporation or sputtering with the use of a suitable mask. Before the deposition of the first electrode interconnector excess polymers were wiped out from the substrate.

Example 10

Encapsulation of polymer photovoltaic pixel wrap tandem cells.

Figure 9A:
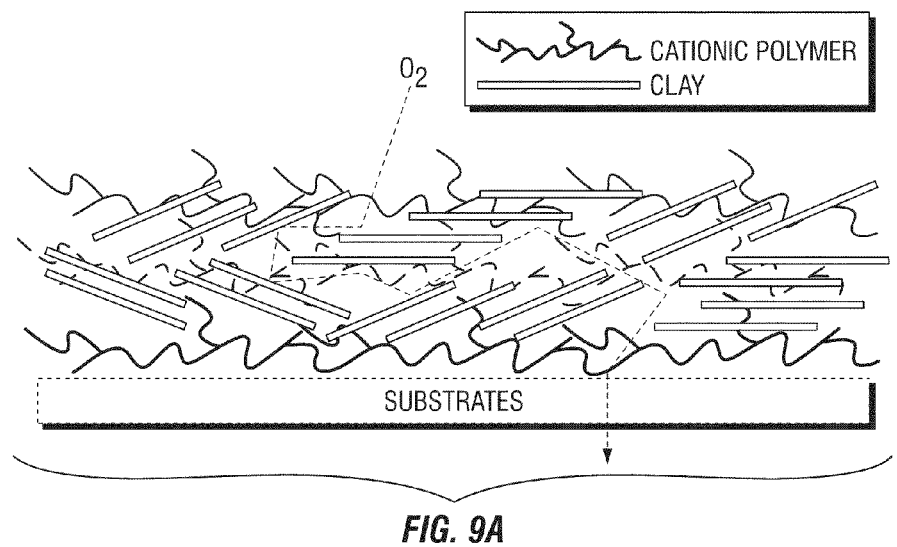
FIG. 9A shows a schematic representation of a tortuous path that oxygen gas takes to diffuse through a clay-filled polymer.
Figure 9B:
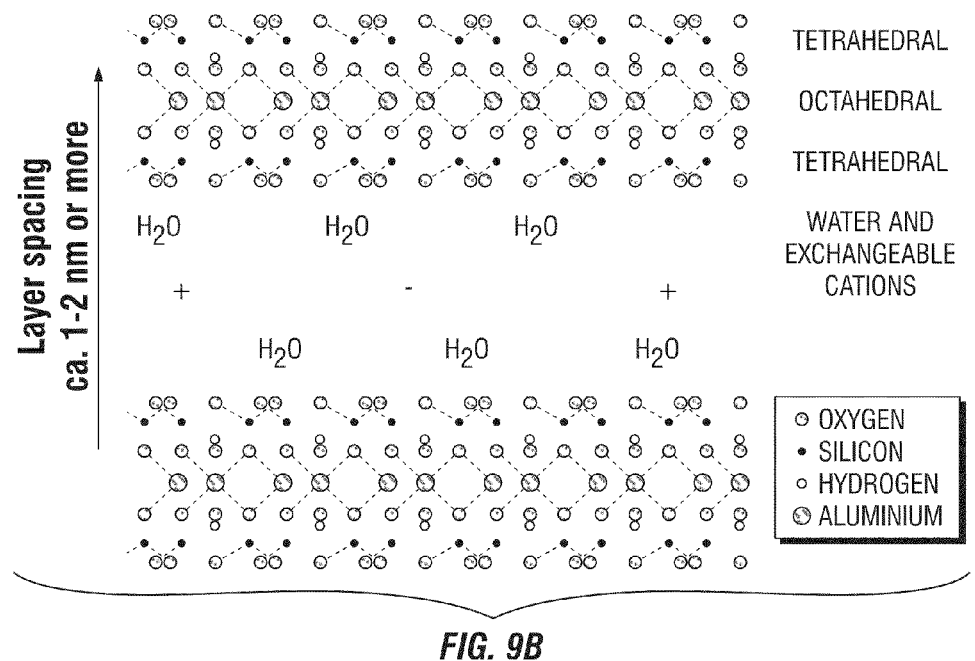
FIG. 9B shows the structure of a montmorillonite clay.

Clay minerals as an example of such an encapsulant, are layered silicate materials, have been especially effective for improving polymer gas barrier and a variety of other properties, e.g. modulus, tensile strength, thermal stability, etc. Clay minerals have been used with a variety of polymers to reduce oxygen permeability. These platelet-type fillers have very large surface areas and high aspect ratios that allow them to significantly alter the behavior of the polymer matrix at very low concentration. When adequately intercalated or exfoliated in a polymer matrix, these impermeable platelets serve to create a microscopic obstacle course, also known as a tortuous path (as shown in FIG. 9A) that dramatically increases the time necessary for the oxygen to diffuse through the polymer. FIG. 9A shows a schematic representation of a tortuous path that oxygen gas takes to diffuse through a clay-filled polymer. When adequately intercalated or exfoliated in a polymer matrix, these impermeable clay platelets serve to create a microscopic obstacle course that dramatically increases the time necessary for the oxygen to diffuse through the polymer to reach the substrate. FIG. 9B showed the structure of a montmorillonite clay. Noted the distance between each intercalated platelets is around 1 nm scale. However, the surface area of each platelet can be as large as $\mu m^2$ scale. By adjusting the clay/polymer ratio in the composite, one can control the ratio of intercalated and exfoliated clay, which can affect the thickness (from 10 nm to 10 µm) and transparency (up to 90% at 550 nm) of the final encapsulation layer. This clay/polymer composite will be ideal for encapsulation of the polymer photovoltaic pixel wrap tandem cells. This inorganic-organic hybrid coating represents a whole new encapsulation system apart from the traditional physical encapsulation of silicon based solar cells. It acts as an adhesive/sealing layer barrier against water vapor and gases, as well as an outside layer for weatherability. It is especially suitable for flexible modules and non-planer surfaces in the organic polymer photovoltaic pixeled wrap design.

To prepare clay/polymer composites, a cationic polymer, such as polyethylenimine (PEI) or poly(diallyldimethylammonium chloride) (PDDA), was mixed with clay (Montmorillonite) in aqueous solution. The deposition of the clay/polymer composite was achieved by either spin-coating on top of electrode (cathode) of the wrap cells or dipping the whole wrap cells into the composite solution, followed by drying under Nitrogen. Full encapsulation could be achieved by multilayer deposition. This polymer deposition can be readily adapted to industrial coating process such as roll-to-roll or doctor-blading for large area encapsulation.

Example 11

Wrapping the flat panel around a solid support.

Figure 10A:
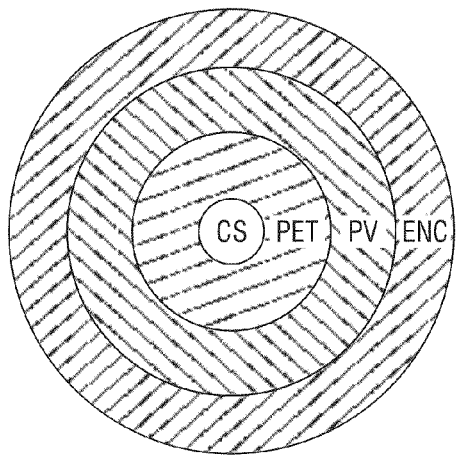
FIG. 10A shows a configuration to wrap a pixel tandem cell using a central support with the substrate oriented inwardly.
Figure 10B:
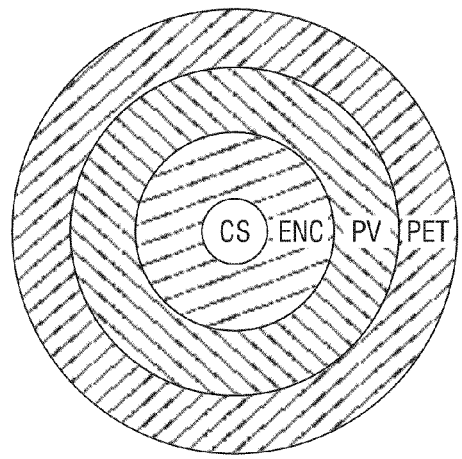
FIG. 10B shows a configuration to wrap a pixel tandem cell using central support with the encapsulant oriented inwardly.
Figure 10C:
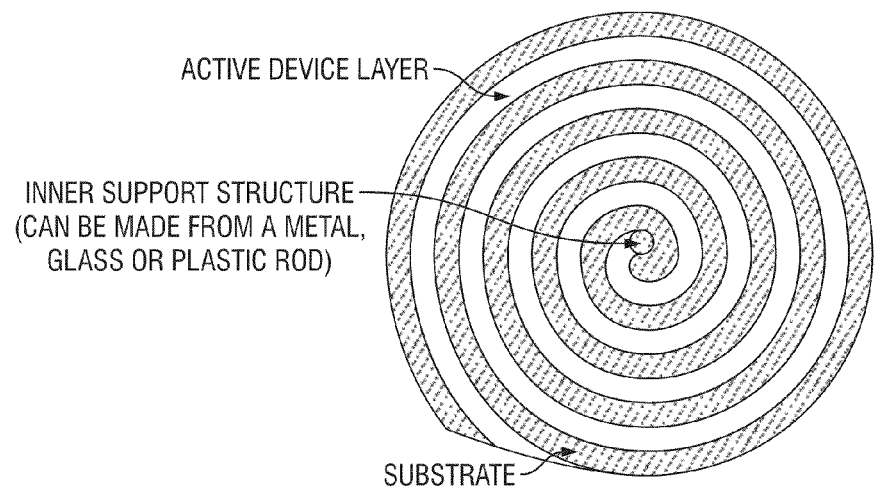
FIG. 10C shows how a wrap can be configured.
Figure 11:
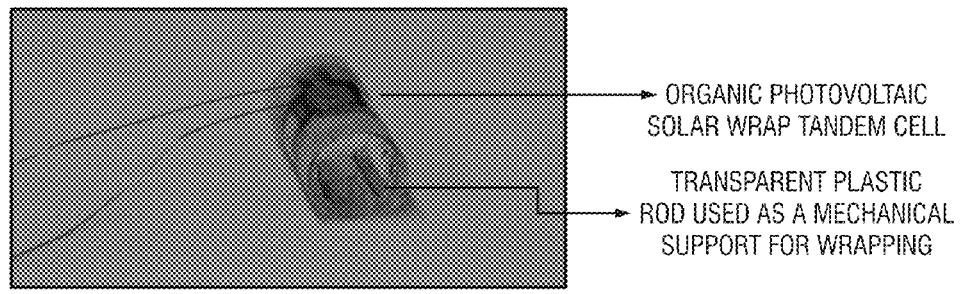
FIG. 11 shows a photograph of a prototype single active layer pixel tandem wrap cell wrapped around a plastic rod.

Once the flat panel pixel arrayed cell was encapsulated, it was ready for the wrapping process. The cell can be wrapped in one of two possible configuration; (a) center support substrate and (b) center support encapsulation as shown in FIGS. 10A and 10B, respectively. FIGS. 10A and 10B show two ways of wrapping the flat panel pixel tandem cell. Part 'a' shows the wrap configuration where the cell is wrapped by supporting the substrate in the center and in part 'b' the cell is wrapped supporting the encapsulation. One end of the flat panel pixel tandem cell is fixed in position and the other end is affixed to a central support. The central support was then rolled along the length to wrap the polymer photovoltaic cell. The other end is then unclamped and fastened in place. It will be understood that FIGS. 10A and 10B primarily schematically illustrate the orientation of the substrate and encapsulant and are not intended to limit the wrapped panel to a circular cross-section. A panel in either orientation can can be wrapped in a manner shown in FIG. 10C. Any suitable material which can act as a support and act as a waveguide like plastic, glass, optical fiber can be incorporated as the central support. FIG. 11 shows a prototype single active layer photovoltaic pixel tandem wrap cell wrapped around a plastic rod. The diameter of the rod shown here was 12 mm, but can be as small as 10 µm. The substrate was PET, but can be another suitable transparent plastic substrate.

Example 12

Architecture of an organic photovoltaic pixel tandem wrap cell.

Figure 12A:
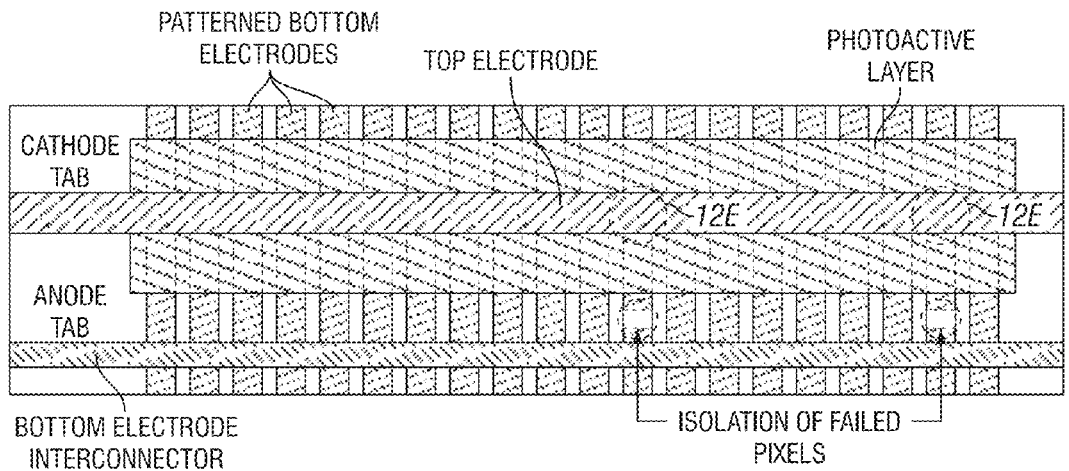
FIG. 12A shows a cross-sectional view of a pixel tandem wrap cell prior to wrapping.
Figure 12B:
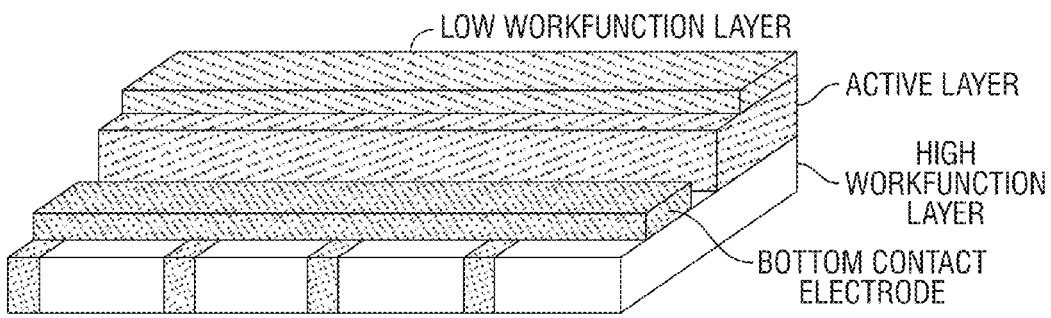
FIG. 12B shows a perspective view of a pixel tandem wrap cell prior to wrapping.
Figure 12C:
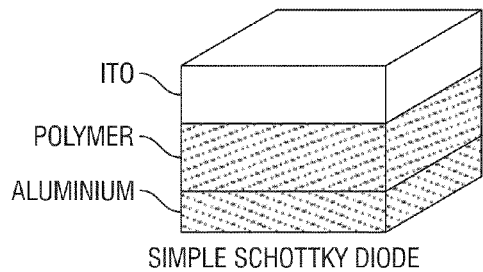
FIG. 12C shows a typical simple minicell device with different layer types prior to multi-contacting and wrapping.
Figure 12E:
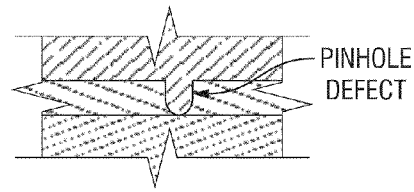
FIG. 12E shows a close-up of one of the pin-hole defects indicated in FIG. 12A.
Figure 12D:
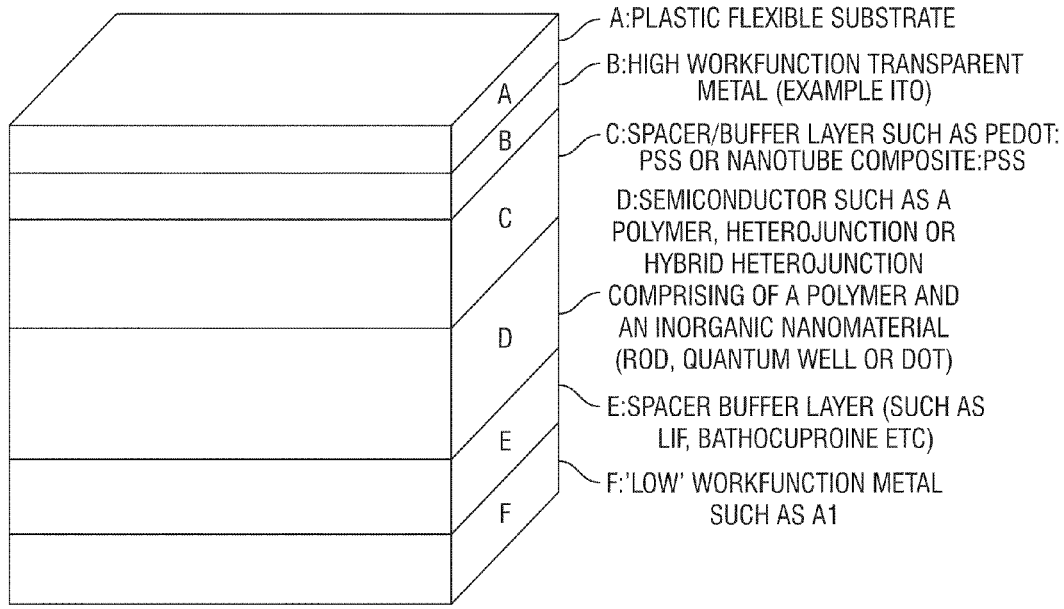
FIG. 12D shows a typical complex minicell device with different layer types prior to multicontacting and wrapping.

The wrap solar cell architecture was constructed in a pixelated fashion. It was essentially composed of multiple solar cells connected in parallel to each other as depicted in FIGS. 12A-E. Each device such as shown in FIGS. 12A and 12B was connected together by a gold electrode. It will be understood that other high conductive metal, such as Pt, Pd, or Ag as examples may be used in place of the gold electrode. If any of the devices showed a form of short circuiting, they were disconnected from the rest of the devices by disconnecting the area of ITO connected to the device to the Au joining electrode. FIG. 12C shows a typical minicell device with different layer types prior to multi-contacting and wrapping. FIG. 12D shows another typical minicell device with different layer types prior to multi-contacting and wrapping. The critical layers are the substrate (A), the semiconductor layer (D) and the two electrodes (B & F). The other layers can be used to enhance the performance of the device and improve the quality and/or efficiency as well as decrease the number of pinholes generated. FIG. 12E shows one of the pin-hole defects indicated in FIG. 12A.

The wrap cell architecture is composed of spin coated photoactive layers one after the next, In this case the first layer was spin coated on etched ITO striped substrate. An electrode as deposited on top of the photoactive materials. A gold paste as used to connect the layers in a very basic device. It will be understood that one can also use a mask and sputter a contact layer connecting all the different pixel devices. The fabrication strategy of pixel tandem wrap cell allows enhanced flexibility in the process. Deposition of different layers of the cell can be carried out in multiple ways once a desired substrate is obtained. The critical semiconducting layer as well as the optional buffer and spacer layers can be coated on the substrates by different coating methods such as screen printing, inkjet printing, dip coating or spray coating. Similarly the electrodes can be deposited using techniques such as thermal evaporation, sputtering or lithography.

Figure 13:
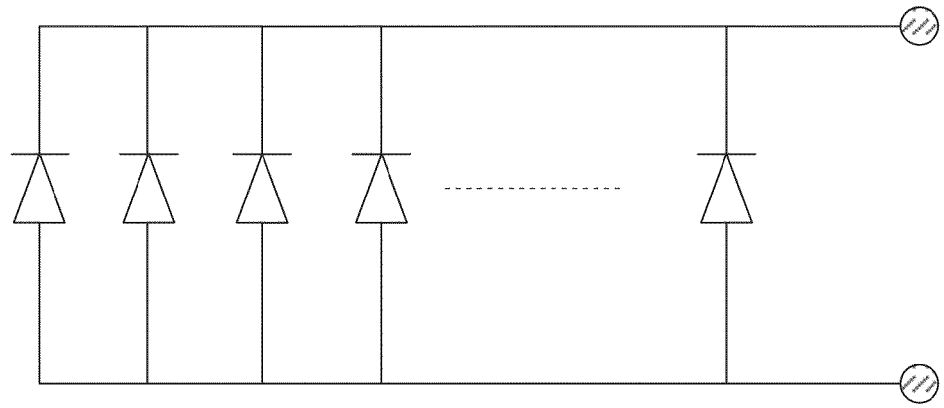
FIG. 13 shows a simplified equivalent circuit diagram of a pixel tandem wrap cell.

FIG. 13 shows the simplified equivalent circuit diagram of such architecture. The circuit consists of a number of diodes connected in parallel, although in different electrical configurations in series can also be used. In particular, FIG. 13 shows a simplified equivalent circuit diagram of a pixel tandem wrap cell. The circuit contains a number of diodes connected in parallel. However, the circuit can be connected in series as well.

Figure 14:
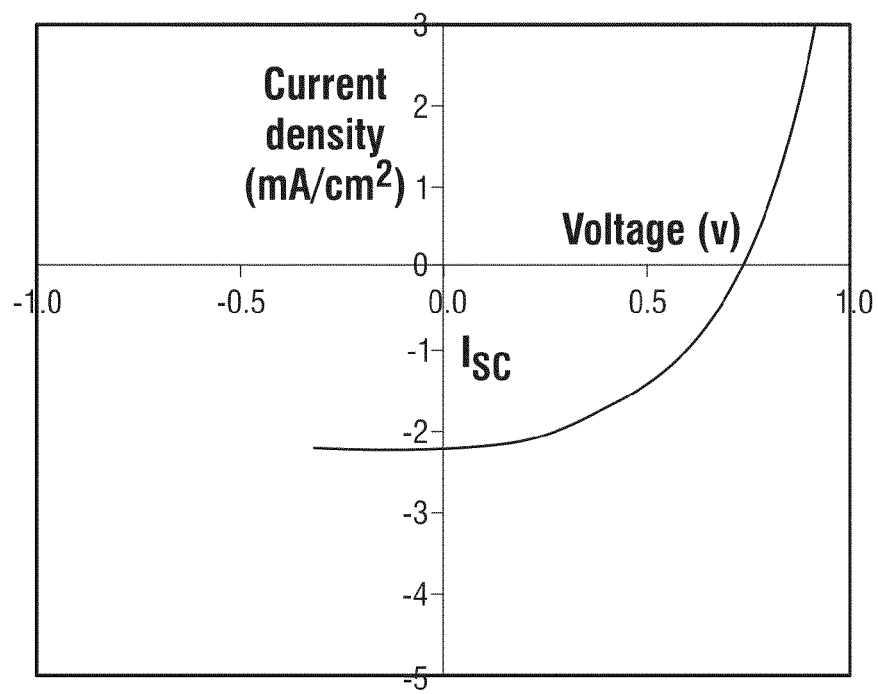
FIG. 14 shows a simulation current-voltage curve of a thin tandem single solar cell.

FIG. 14 shows a simulation current-voltage (i-v) curve using the equivalent circuit above for a single solar cell with only one active layer.

Figure 15:
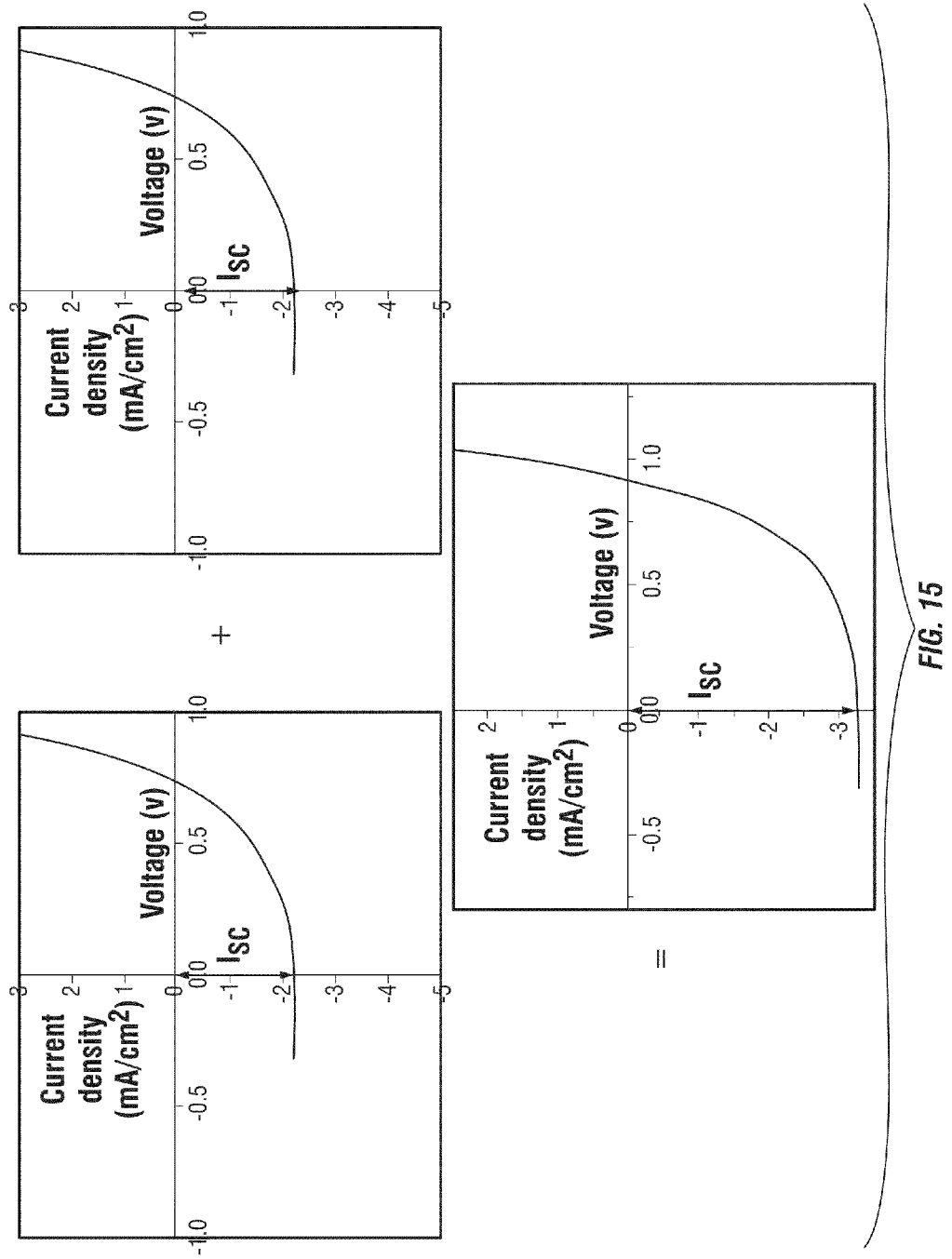
FIG. 15 shows a simulation current-voltage curve for two devices connected together.

FIG. 15 shows the simulation i-v curve for two devices connected together, generating the sum of the short circuit current. Parallel connection of diodes adds up the short circuit currents ($I_{sc}$) of each diode and total $I_{sc}$ increases. Referring to FIG. 15, the open circuit voltage in the final wrap cell (ignoring such matters such as morphology) is dependent on the interface and work-function difference between both electrodes. Shown in the current-voltage (i-v) curves, under good fabrication conditions, one can keep the $V_{oc}$ reasonably consistent in terms of its output. However, by having multiple devices across the architecture, the current output adds up in the form ($J_1+J_2+J_3+\ldots+J_n$) so that overall one can achieve a greater current. Within the wrap structure (following pixilation) the number of contributing currents per unit area is increased, and so mimic a full area electrode while avoiding pinhole issues.

Figure 16:
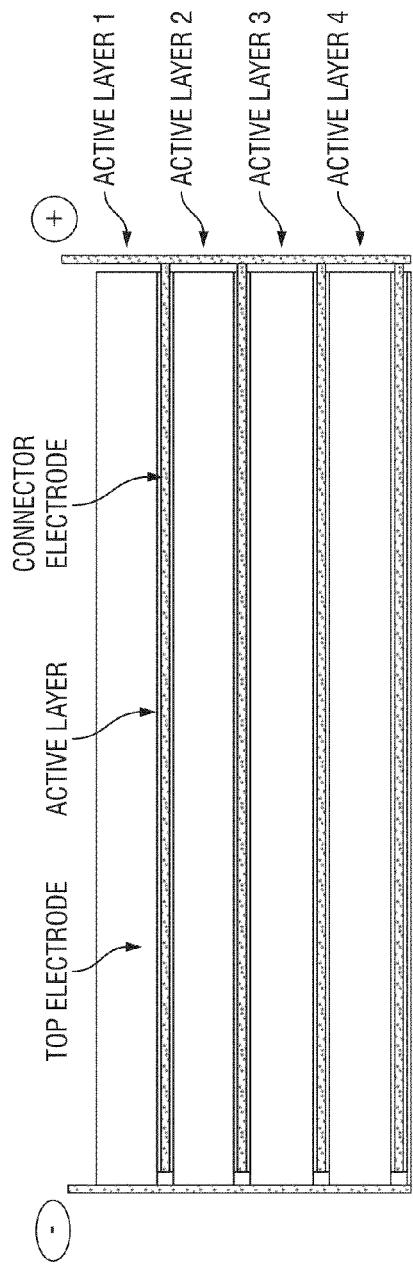
FIG. 16 shows the topography of a tandem cell before wrapping.

FIG. 16 illustrates an embodiment of the present invention where more than one active layer can be used. In fact the tandem nature of the devices allows such multiple combinations, each device being used to manage a specific predefined spectral region. By having multiple active layers, it is possible to broaden out the spectral absorption and generate a greater current overall by attaching all the devices in the manner shown. FIG. 16 shows the topography of the tandem nature of the cells before wrapping. The tandem nature of the devices allows multiple combinations. Each device with a specific active layer is used to manage a specific predefined spectral region. By having multiple active layers as described in the present invention, it is possible to broaden out the spectral absorption and generate a greater current overall by attaching all the devices in the manner shown.

The present architecture offers great benefits from a fabrication standpoint by avoiding short circuits across the entire solar cell. A solar cell will be made up of multiple pixel devices, each one connected separately to the overall macro cell. If one of these pixels short circuits, one can disconnect it from the rest of the devices, so reducing the failure rate of the devices and allowing a larger area of cells to be used. Device fabrication and pinholes are a serious limitation when fabricating large scale photovoltaic devices and the pixel nature of the devices gets over the problem by isolating smaller pixel devices and being able to disconnect them when a short circuit occurs on defective pixel devices. The overall effect is that large area devices can be fabricated, without the possibility of a single pixel destroying the macro cell, as shown in FIG. 16.

The present invention overcomes this limitation by forming multiple small devices, therefore reducing the likelihood of producing pinholes. In the event that a device short circuits (due to fabrication defects), the present architecture allows one to easily disconnect it from the rest of the devices and therefore isolating its negative influence across the devices. The present design allows one to have the option of making large area pixilated architectures. This approach offer greater chances of fabricating defect free devices at the macroscale, even if a few of the devices in the overall architecture are failures.

In addition to morphological issues (such as defects and pinholes), the open circuit voltage is another critical characteristic of photovoltaic devices. The open circuit potential ($V_{oc}$) is dependent on the interface and work-function difference between both the bottom and second electrodes. As depicted by the i-v curves above, it is expected that the $V_{oc}$ should be reasonably consistent in terms of its output—under reasonably good fabrication conditions. The advantage of having multiple devices across the architecture is that the expected current output is in the form ($J_1+J_2+J_3+\ldots+J_n$) so that overall a greater current can be reached.

The final step of the wrap is actually wrapping the device. Once the flat panel is formed as defined above, the structure is then wrapped to form multiple layers similar to that seen in rolled paper. The diameter of the wrap is then defined by the electricity generation output. Shown in FIG. 11 is a simple single active layer wrap cell. A central support may be used for mechanically stabilizing the devices which then allows us to anchor the inner layers. To optimize the devices, it is best to have a lens used at the top of the wrap to channel the diffused light into the pixel tandem wrap cell. The light will reflect throughout the architecture and the resonant light to the active layers will be absorbed.

Example 13

Architecture of organic pixel tandem light emitting diodes.

Figure 17:
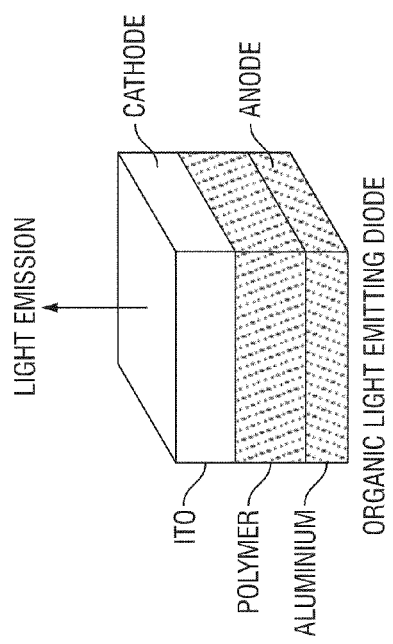
FIG. 17 shows an architecture of a simple Organic Light Emitting diode (OLED)

Similar architectures of the organic photovoltaic pixel tandem wrap cell can be adapted to organic pixel tandem light emitting diodes as well. A complex OLED architecture is shown in FIG. 17. Referring to FIG. 17, rather than generation charge carriers within the organic layer, we can also apply an electrical field to generate light emission. The applied field promotes electrons to a higher excited states, and when the electron relaxes it emits light. The architecture of the pixel system reduces the number of failed OLED cells while the wrapping process can then be used to channel the light out from the device, in particular if a lens is used to create the focused emission. Between the cathode and anode, a p-type material such as poly(p-phenylenevinylene) (PPV) and a n-type material such as perylene diimide derivatives (PDI) can be used as a hole transport material (HTM) and an electron transport material (ETM), respectively. An organic dye or inorganic metal complex with high electroluminescent efficiency can be used as the emitter sandwiched between HTM and ETM. This multilayered device configuration allows the independent optimization of organic materials for charge transport, light absorption, and charge photo-generation in photoreceptors.

The wrap architecture can also be used to form an organic light emitting diode (OLED) array. The device is fabricated in a similar fashion to that of the photovoltaic tandem wrap cell. The electroluminescent material is deposited on the substrate along with appropriate anode/cathode material combinations. This device has added flexibility as it may be configured to either emit light from the top or the bottom of the layered structure or ideally utilizing a semi-transparent anode and cathode so that it can emit light in both directions. Analogous to each pixel being an interconnected (serial/parallel configuration) solar cell, the wrap architecture OLED is comprised of a array of OLED pixels connected to a common parallel anode/cathode connection configuration. This design concept is advantageous because it may address emitted light intensity issues as well as increase device lifetime by utilizing a more effective encapsulation process.

All emitted light will be collected by the substrate which can act as a waveguide to channel the light to the aperture lens at the top of the wrap architecture. This lens is selected to collect light from the wrap and either collimate/focus/disperse it. The lensing system may also be part of an interchangeable optical filter system. The emission spectrum of the wrap architecture OLED can be tailored to suit specific application requirements in a similar fashion as the absorption spectrum. Appropriate selection of electroluminescent materials may yield less conventional emission spectra possibly combining two very different spectral regions for light output. The user can select to have a versatile broadband emission wrap OLED and selectively choose what part of the light spectrum is emitted by appropriate filter choice. Some modifications to the Pixel Tandem Wrap Cell design include an addition to the outermost side walls and base of the wrap with a mirror or highly reflective material which will ensure efficient use of all light emitted from the pixels.

Example 14

Architecture of another photovoltaic pixel cell.

The following example formation of a flat panel cell with a pixel architecture. Although illustrated for a glass substrate the method may be adjusted for a plastic substrate. Thus, it may used to produce a cell that is adapted to be wrapped.

Figure 18A:
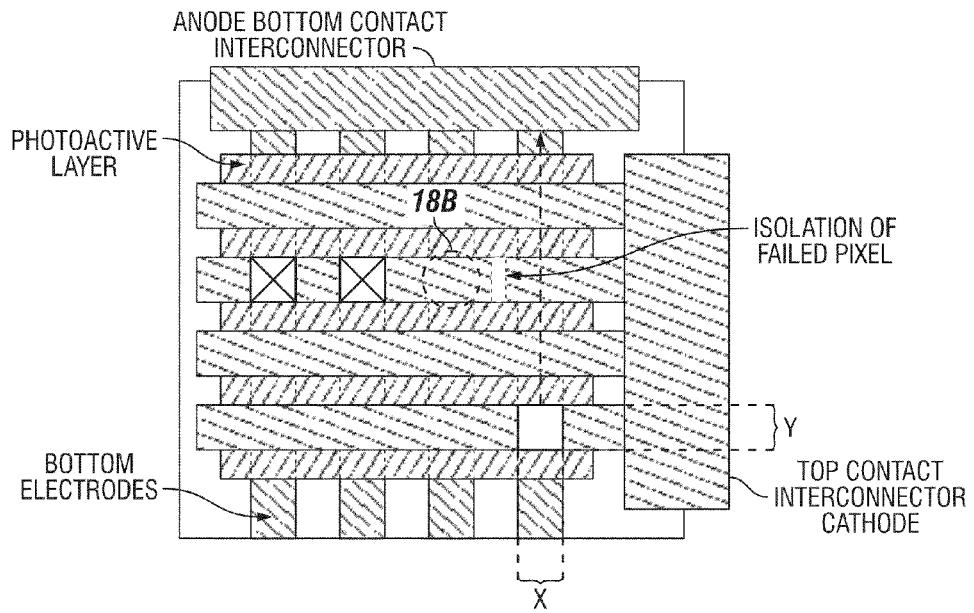
FIGS. 18A and 18B show a schematic of an electrode geometry using a crossbar layout.
Figure 18B:
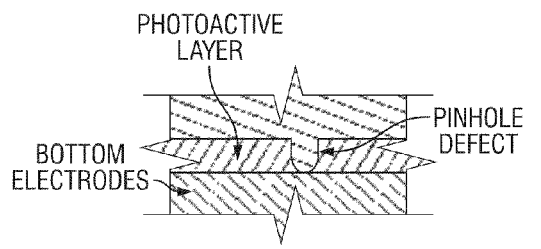
Figure 19B:
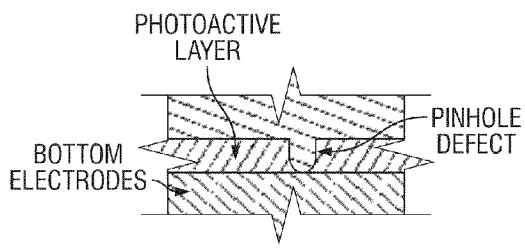
FIGS. 19A and 19B show a schematic of the electrode geometry using a linear pixel array layout.
Figure 19A:
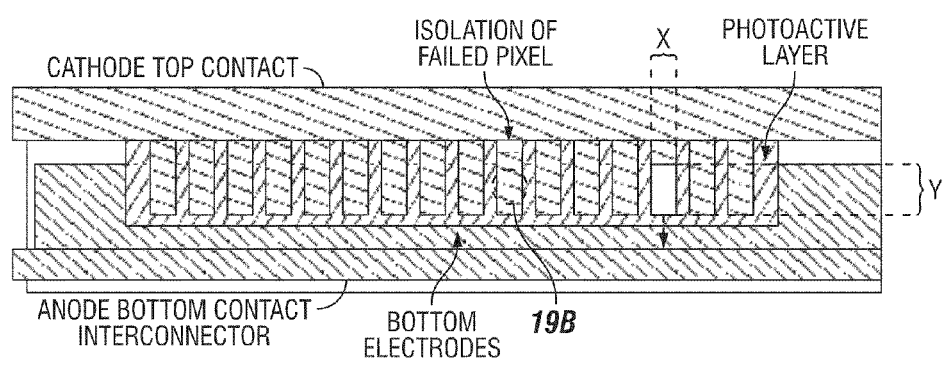

The crossbar and linear pixel array OSCs were fabricated following a specific procedure. First, the substrate (ITO-coated glass slide with 8-12Ω/□ surface resistivity, Aldrich) was etched using Zinc powder/18% $HCl_{(aq)}$ for 10 seconds, followed by sonication with 1.5% Micro 90 (15 minutes), water (15 min×2 cycles) and isopropanol (15 minutes) to form the desired pattern of ITO bottom contact (anode) as illustrated in FIGS. 1 and 2. An interconnector (usually Au) was sputtered on top of the exposed ITO bottom contacts. The substrate was subsequently treated with ozone plasma for 6 min and then a PEDOT:PSS (Clevios PH750, H. C. Starck) layer was spin-coated at 3000 rpm for 3 min. The substrates were dried in an 80° C. oven for 1 hour and a P3HT/PCBM (purchased separately from Aldrich) (12 g/L in anhydrous chlorobenzene with 1:0.68 ratio by weight) layer was spin-coated on top of the PEDOT:PSS layer at 2200 rpm for 2 minutes. The resulting substrates were solvent-annealed in an environment filled with chlorobenzene vapor at room temperature for 30 minutes and dried in an 80° C. oven for 1 hour. Patterned Al electrodes were thermally evaporated on top of the P3HT/PCBM layer as depicted in FIGS. 18 and 19 by a custom made shadow mask. All devices were encapsulated with glass slides using epoxy resin in an inert nitrogen atmosphere (~10% relative humidity) before characterization.

Characterization of OSCs. An Abet LS 150 Xenon Arc Lamp Source coupled with an AM 1.5G filter (calibrated with Oriel 91150V Solar Reference Si Cell certified by NREL) was used as the light source. All measurements were performed in a nitrogen filled glove box (~10% relative humidity). The light source was adjusted to illuminate the devices with 1 sun (100 mW/cm$^2$). Current-Voltage characteristics were determined using a Keithley 2400 SourceMeter. The dimension of each pixel was determined by a Leistz ERGOLUX microscope with a micrometer scale in 0.05 mm divisions. Devices fabricated at our current laboratory condition exhibited an average PCE ~2.6% ($V_{oc}$ ~0.61 V, $J_{sc}$ ~7.8 mA/cm$^2$ and FF ~0.55).

FIG. 18 shows a schematic of an electrode geometry using a crossbar layout. The area of each pixel is defined by the width of the anode stripe (x) and the width of the cathode stripe (y). The red arrow depicts the distance needed to travel for the current (holes) to reach the collector, which varies from pixel to pixel. Isolation of a failed pixel shorting the whole module (the red circle) will inevitably cut off some working cells (the black squares).

FIG. 19 shows a schematic of the electrode geometry using a linear pixel array layout. The area of each pixel is defined only by the area of the cathode (x·y) overlapped with the anode. The red arrow depicts the distance needed to travel for the current (holes) to reach the collector, which is the same for all pixels. Isolation of a failed pixel shorting the whole module (the red circle) will not affect the rest of the working cells.

Figure 20:
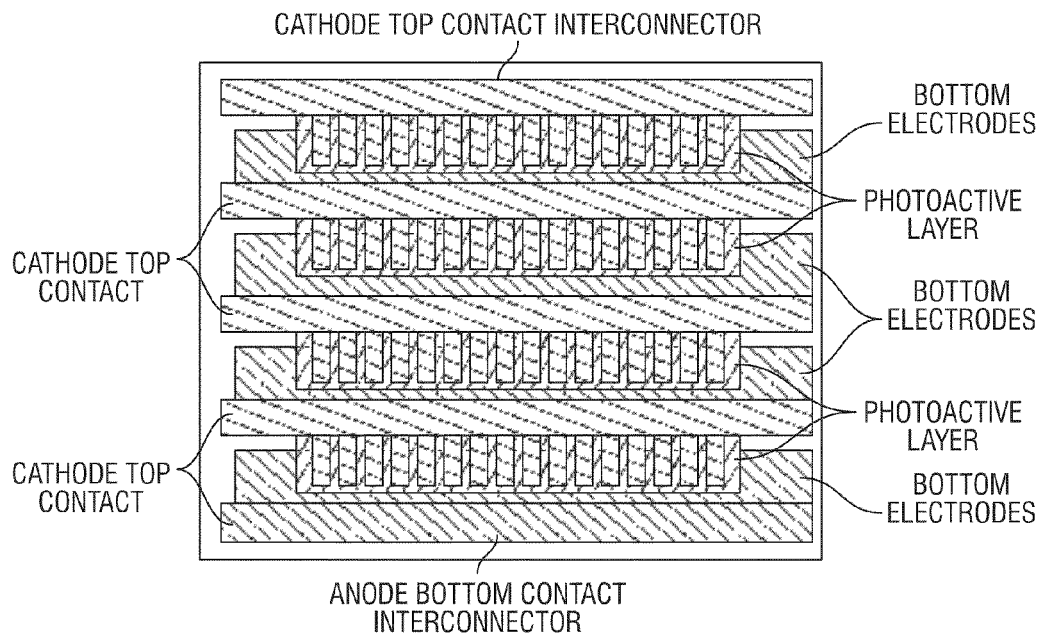
FIG. 20 shows a schematic of the electrode geometry using multiple linear pixel arrays.

FIG. 20 shows a schematic of the electrode geometry using multiple linear pixel arrays. Each array has 16 pixels connected in parallel. Four individual arrays are connected in series to form the whole module.

Figure 21:
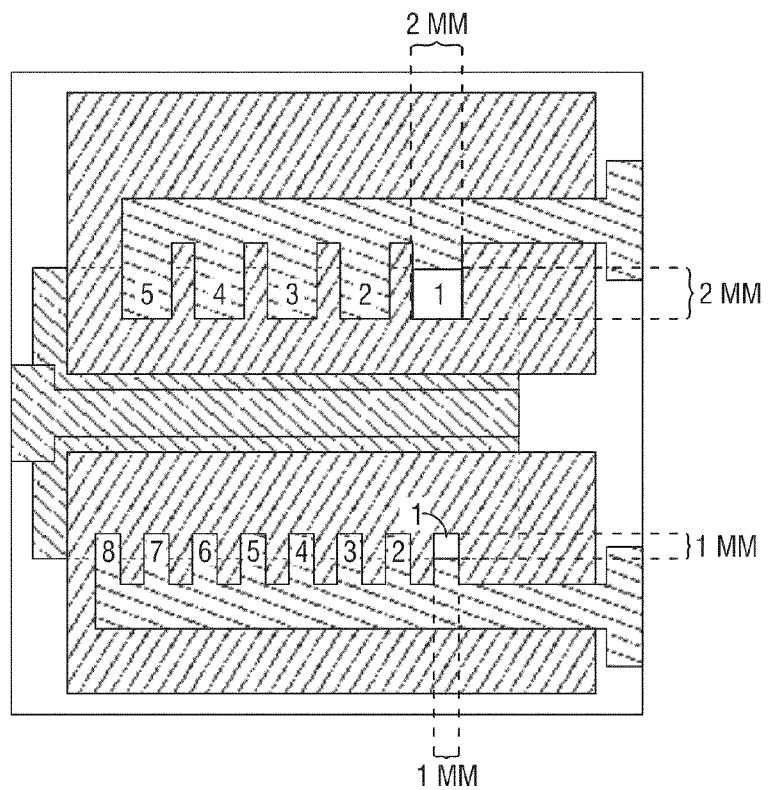
FIG. 21 shows a schematic example of linear pixel array layout.

FIG. 21 shows a schematic example of linear pixel array layout used in this study. Two linear pixel arrays with different pixel area are deposited at the same ITO slide in order to properly compare the PCE of each array with its area.

Figure 22:
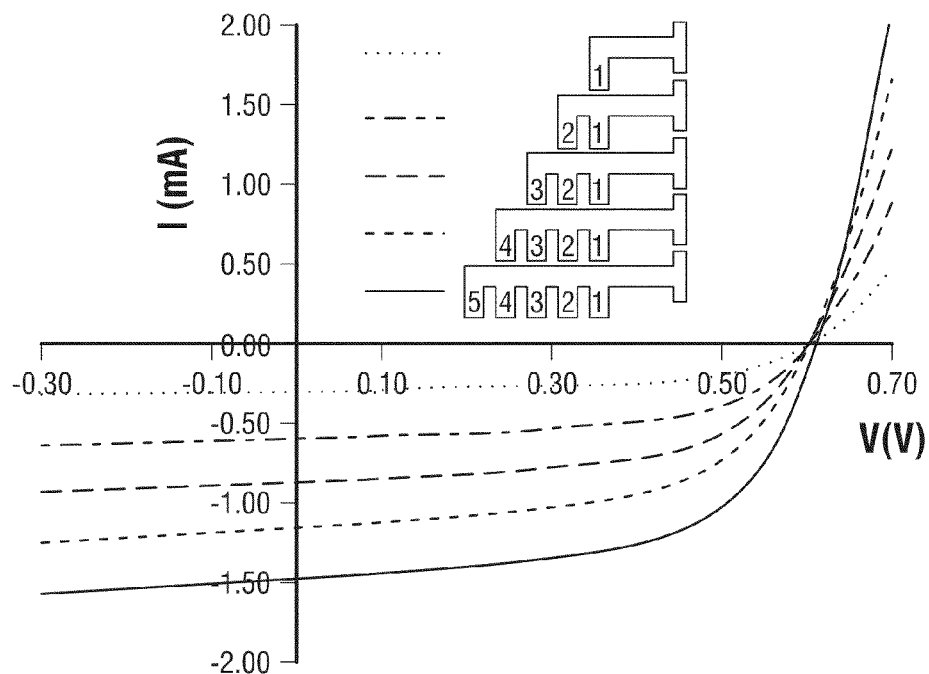
FIG. 22 shows the current-voltage characteristics of various linear pixel arrays with additional number of pixels.

FIG. 22 show the current-voltage characteristics of various linear pixel arrays with additional number of pixels. A scalable current output through parallel connections was observed.

Figure 23:
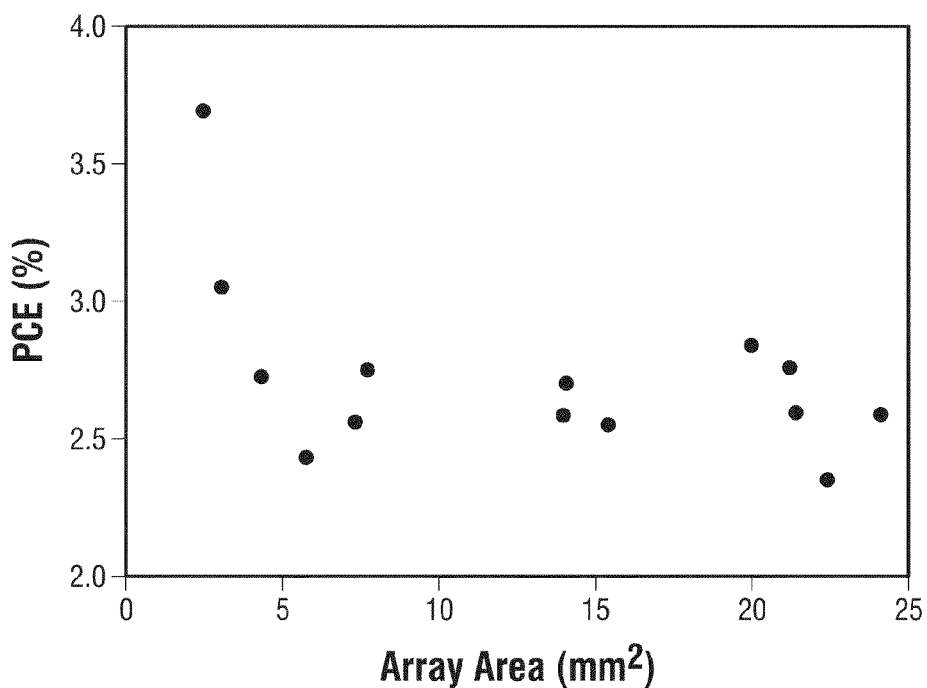
FIG. 23 shows a variation of PCE of linear pixel array with different array area.

FIG. 23 shows a dependence of PCE of linear pixel array with different array area. All devices were fabricated and characterized at the same laboratory condition.

From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure, which is defined in the following claims.

What is claimed is the following:

1. An optoelectronic device, said optoelectronic device comprising:
    a central axis; and
    a flat panel wrapped circumferentially around the central axis more than a complete turn in a spiral manner where an entire width of the flat panel fully overlaps on top of itself, wherein the flat panel comprises:
    a semi-transparent first conductive layer;
    a semi-conductive layer disposed over and in electrical communication with the first semi-transparent conductive layer; and
    a second conductive layer disposed over and in electrical communication with the semi-conductive layer,
    wherein layering of the semi-transparent first conductive layer, the semi-conductive layer, and the second conductive layer is oriented inwardly towards the central axis;
    wherein the semi-transparent first conductive layer comprises a first patterning so as to form a plurality of first electrodes; wherein the first patterning comprises latitudinal separation of the plurality of the first electrodes relative to the central axis;
    wherein the semi-conductive layer comprises a plurality of semi-conductor regions containing a different semi-conductor from the others semi-conductor regions, wherein the plurality of semi-conductor regions vary latitudinally relative to the central axis, wherein the second conductive layer comprises a second patterning so as to form a plurality of second electrodes; wherein the plurality of the second electrodes are arranged azimuthally around the central axis with azimuthal spacing relative to the central axis separating the second electrodes;

and wherein the first and second patternings form a pixel array.

2. The optoelectronic device according to claim 1, further comprising a central support.

3. The optoelectronic device according to claim 1, wherein the first semi-transparent conductive layer is disposed over a substrate.

4. The optoelectronic device according to claim 3, wherein the substrate comprises a transparent polymer.

5. The optoelectronic device according to claim 1, wherein an encapsulant is disposed over the second conductive layer.

6. The optoelectronic device according to claim 5, wherein the encapsulant comprises a clay.

7. The optoelectronic device according to claim 1, wherein the first semi-transparent conductive layer comprises at least one gold anode.

8. The optoelectronic device according to claim 1, wherein the optoelectronic device comprises a photovoltaic device.

9. The optoelectronic device according to claim 1, wherein the optoelectronic device comprises an organic light emitting diode.

10. An optoelectronic device comprising: a central support; and
a flat panel circumferentially wrapped around the central support more than a complete turn in a spiral manner where an entire width of the flat panel fully overlaps on top of itself, the flat panel comprising:
a substrate;
a semi-transparent first conductive layer disposed over the substrate;
a semi-conductive layer disposed over and in electrical communication with the first semi-transparent conductive layer;
a second conductive layer disposed over and in electrical communication with the semi-conductive layer; and
an encapsulant disposed over the second conductive layer;
wherein layering of the semi-transparent first conductive layer, the semi-conductive layer, the second conductive layer, and the encapsulant is oriented inwardly towards the central support;
wherein the semi-conductive layer comprises a plurality of semi-conductor regions each containing a different semi-conductor from the others semi-conductor regions, wherein the plurality of semi-conductor regions vary latitudinally relative to the central support;

wherein the semi-transparent first conductive layer comprises a first patterning so as to form a plurality of first electrodes; wherein the first patterning comprises latitudinal separation of the plurality of the first electrodes relative to the central support;

wherein the second conductive layer comprises a second patterning so as to form a plurality of second electrodes; wherein the plurality of the second electrodes are arranged azimuthally around the central support with azimuthal spacing relative to the central support separating the plurality of the second electrodes; and wherein the first and second patternings form a pixel array.

11. The optoelectronic device according to claim 10, wherein the substrate comprises a polymer, the encapsulant comprises a clay, and the plurality of the first electrodes comprise gold anodes.

12. The optoelectronic device according to claim 10, wherein the optoelectronic device comprises a photovoltaic device.

13. The optoelectronic device according to claim 10, wherein the optoelectronic device comprises an organic light emitting diode.

14. The optoelectronic device according to claim 1, wherein the semi-conductive layer is an organic semi-conductive material.

15. The optoelectronic device according to claim 10, wherein the semi-conductive layer is an organic semi-conductive material.

16. The optoelectronic device according to claim 1, further comprising a conductive electrode interconnect layer disposed over and in electrical communication with the plurality of the second electrodes, wherein the conductive electrode interconnect layer is patterned to be parallel to the first semi-transparent conductive layer and longitudinally separated from the plurality of the first electrodes along the central axis to avoid electrical communication.

17. The optoelectronic device according to claim 1, wherein the plurality of semi-conductor regions form a continuous layer.

18. The optoelectronic device according to claim 10, further comprising a conductive electrode interconnect layer disposed over and in electrical communication with the plurality of the second electrodes, wherein the conductive electrode interconnect layer is patterned to be parallel to the first semi-transparent conductive layer and longitudinally separated from the plurality of the first electrodes along the central support to avoid electrical communication.

19. The optoelectronic device according to claim 10, wherein the plurality of semi-conductor regions form a continuous layer.

* * * * *